(12) United States Patent
Kundu et al.

(10) Patent No.: US 12,556,192 B2
(45) Date of Patent: Feb. 17, 2026

(54) ANALOG-TO-DIGITAL CONVERTER, RECEIVER, BASE STATION, MOBILE DEVICE AND METHOD FOR A TIME-INTERLEAVED ANALOG-TO-DIGITAL CONVERTER

(71) Applicant: Intel Corporation, Santa Clara, CA (US)

(72) Inventors: Somnath Kundu, Hillsboro, OR (US); Amy L. Whitcombe, Saratoga, CA (US); Stefano Pellerano, Beaverton, OR (US); Peter Sagazio, Portland, OR (US); Brent Carlton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 638 days.

(21) Appl. No.: 17/933,512

(22) Filed: Sep. 20, 2022

(65) Prior Publication Data
US 2024/0097693 A1 Mar. 21, 2024

(51) Int. Cl.
*H03M 1/10* (2006.01)
*H03M 1/12* (2006.01)
*H04B 1/40* (2015.01)

(52) U.S. Cl.
CPC ........... *H03M 1/1014* (2013.01); *H04B 1/40* (2013.01)

(58) Field of Classification Search
None
See application file for complete search history.

(56) References Cited

U.S. PATENT DOCUMENTS 7,292,170 B2 * 11/2007 Kinyua ............... H03M 1/0624
341/155
7,535,390 B2 * 5/2009 Hsu ..................... H03M 1/1061
341/120

(Continued)

OTHER PUBLICATIONS

D. Stepanovic and B. Nikolic, "A 2.8 GS/s 44.6 mW Time-Interleaved ADC Achieving 50.9 dB SNDR and 3 dB Effective Resolution Bandwidth of 1.5 GHz in 65nm CMOS," IEEE Journal of Solid-State Circuits, vol. 48, No. 4, pp. 971-982, Apr. 2013.

(Continued)

*Primary Examiner* — Tuan A Tran
(74) *Attorney, Agent, or Firm* — SPL Patent Attorneys PartG mbB; Yong Beom Hwang

(57) ABSTRACT

An analog-to-digital converter, ADC, is provided. The ADC comprises multiple time-interleaved sub-ADCs, a detection circuit, and a calibration circuit. The sub-ADCs are configured to, when the ADC is in a calibration mode, generate a first signal by sampling a calibration signal based on a first clock signal and at least a second clock signal. The first clock signal comprises a phase shift relative to the second clock signal. The calibration circuit is configured to determine a first mismatch between the phase shift and a phase shift threshold based on the first signal. The detection circuit is configured to, when the ADC is in an operation mode, generate a second signal by sampling one of a biased signal to be received by the sub-ADCs or a second calibration signal based on at least one of the first clock signal and the second clock signal. The calibration circuit is configured to determine a second mismatch between the phase shift and the phase shift threshold based on the second signal and calibrate the ADC based on the first and the second mismatch.

23 Claims, 16 Drawing Sheets

(56) References Cited

U.S. PATENT DOCUMENTS

| | | | | |
|---|---|---|---|---|
| 7,782,235 | B1* | 8/2010 | Velazquez | H03M 1/1052 455/303 |
| 7,961,123 | B2* | 6/2011 | Nagarajan | H03M 1/1057 341/118 |
| 8,009,070 | B2* | 8/2011 | Johansson | H03M 1/0626 341/118 |
| 8,164,496 | B2* | 4/2012 | Velazquez | H03F 1/3247 455/295 |
| 8,310,387 | B2* | 11/2012 | Harris | H03M 1/0836 341/120 |
| 8,487,795 | B1* | 7/2013 | Jiang | G11C 27/024 327/434 |
| 8,922,418 | B2* | 12/2014 | Elsayed | H03M 1/0845 341/172 |
| 9,041,573 | B2* | 5/2015 | Kull | H03M 1/1215 341/141 |
| 9,065,464 | B2* | 6/2015 | Zhang | H03M 1/0624 |
| 9,264,059 | B2* | 2/2016 | Tousi | H03M 1/183 |
| 9,270,292 | B2* | 2/2016 | Sundblad | H03M 1/1255 |
| 9,287,889 | B2* | 3/2016 | Chiu | H03M 1/0836 |
| 9,306,591 | B2* | 4/2016 | Khoshgard | H03M 1/46 |
| 9,331,708 | B2* | 5/2016 | Sundblad | H03M 1/1245 |
| 9,350,374 | B2* | 5/2016 | Sundblad | H03M 1/004 |
| 9,369,146 | B2* | 6/2016 | Wang | H03M 1/1245 |
| 9,503,115 | B1* | 11/2016 | Shin | H03M 1/0836 |
| 9,793,910 | B1* | 10/2017 | Devarajan | H03M 1/124 |
| 10,312,927 | B1* | 6/2019 | Mirhaj | H03M 1/1033 |
| 10,498,348 | B1* | 12/2019 | Khoshgard | H03M 1/1019 |
| 10,659,072 | B1* | 5/2020 | Lu | H03M 1/1033 |
| 10,742,226 | B1* | 8/2020 | Chen | H03M 1/1038 |
| 10,868,556 | B2* | 12/2020 | Camponeschi | H03M 1/0836 |
| 11,057,044 | B2* | 7/2021 | Lu | H03M 1/1215 |
| 11,082,054 | B1* | 8/2021 | Cascio | H03M 1/0697 |
| 11,552,646 | B2* | 1/2023 | Bal | H03M 1/0624 |
| 11,569,827 | B1* | 1/2023 | Ramakrishnan | H03M 1/066 |
| 12,009,830 | B2* | 6/2024 | Bal | H03M 1/0624 |
| 12,355,458 | B2* | 7/2025 | Menkus | H03M 1/0609 |
| 12,407,357 | B2* | 9/2025 | Molina | H03M 1/1014 |
| 2015/0303934 | A1* | 10/2015 | Chiu | H03M 1/36 341/120 |
| 2020/0313687 | A1* | 10/2020 | Camponeschi | H03M 1/1033 |

OTHER PUBLICATIONS

T. Miki, T. Ozeki, and J. Naka, "A 2GS/s 8b Time-Interleaved SAR ADC for Millimeter-Wave Pulsed Radar Baseband SoC," Proc. of IEEE Asian Solid-State Circuits Conference, pp. 5-8, Nov. 2016.

C.-Y. Wang et. al., "A Multiphase Timing-Skew Calibration Technique Using Zero-Crossing detection" IEEE Transactions on Circuits and Systems I, Jun. 2009.

C. C. Huang et. al., "A CMOS 6-Bit 16-GS/s Time-Interleaved ADC Using Digital Background Calibration Techniques", IEEE Journal of Solid-State Circuits, Apr. 2011.

* cited by examiner

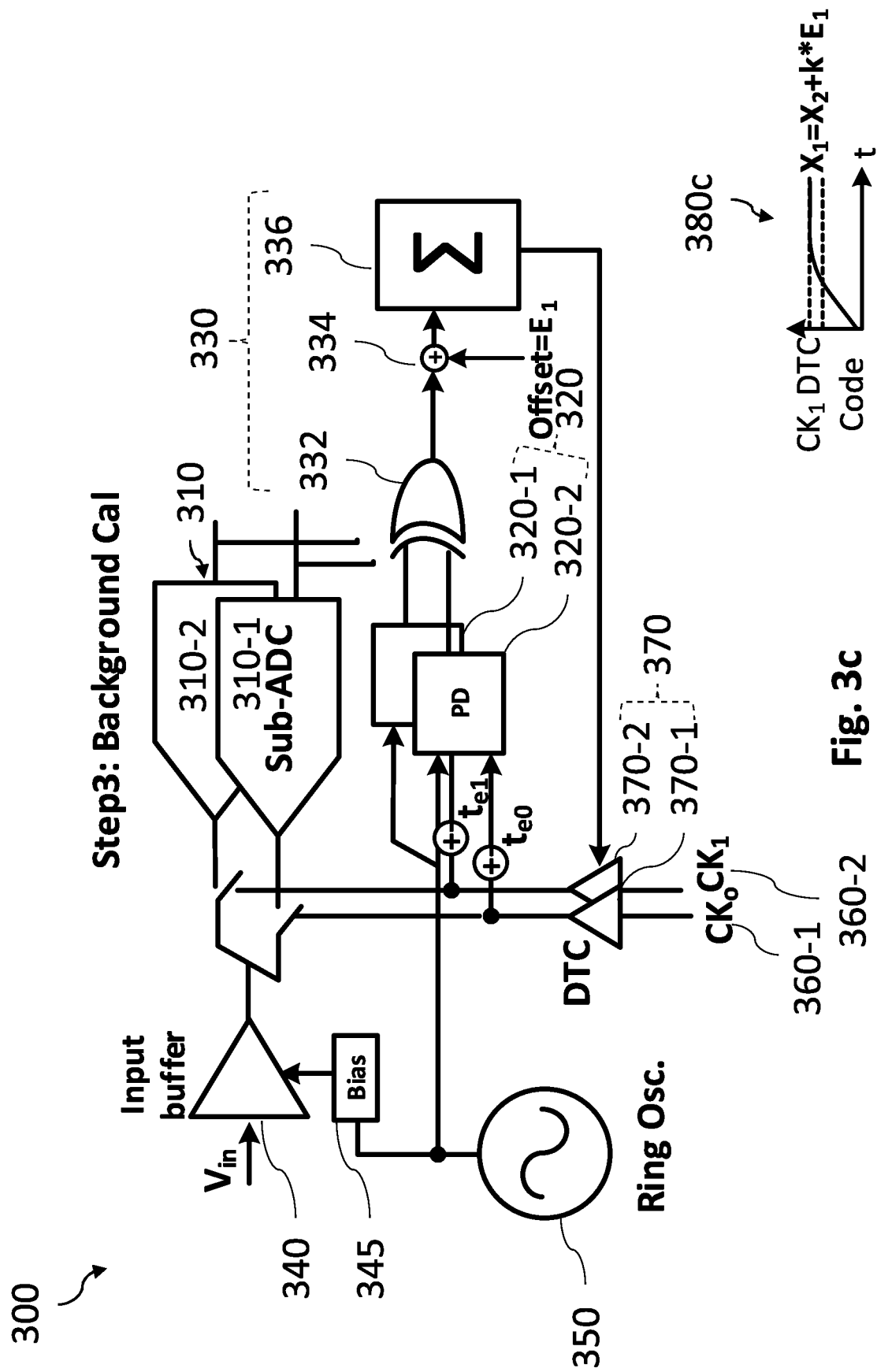

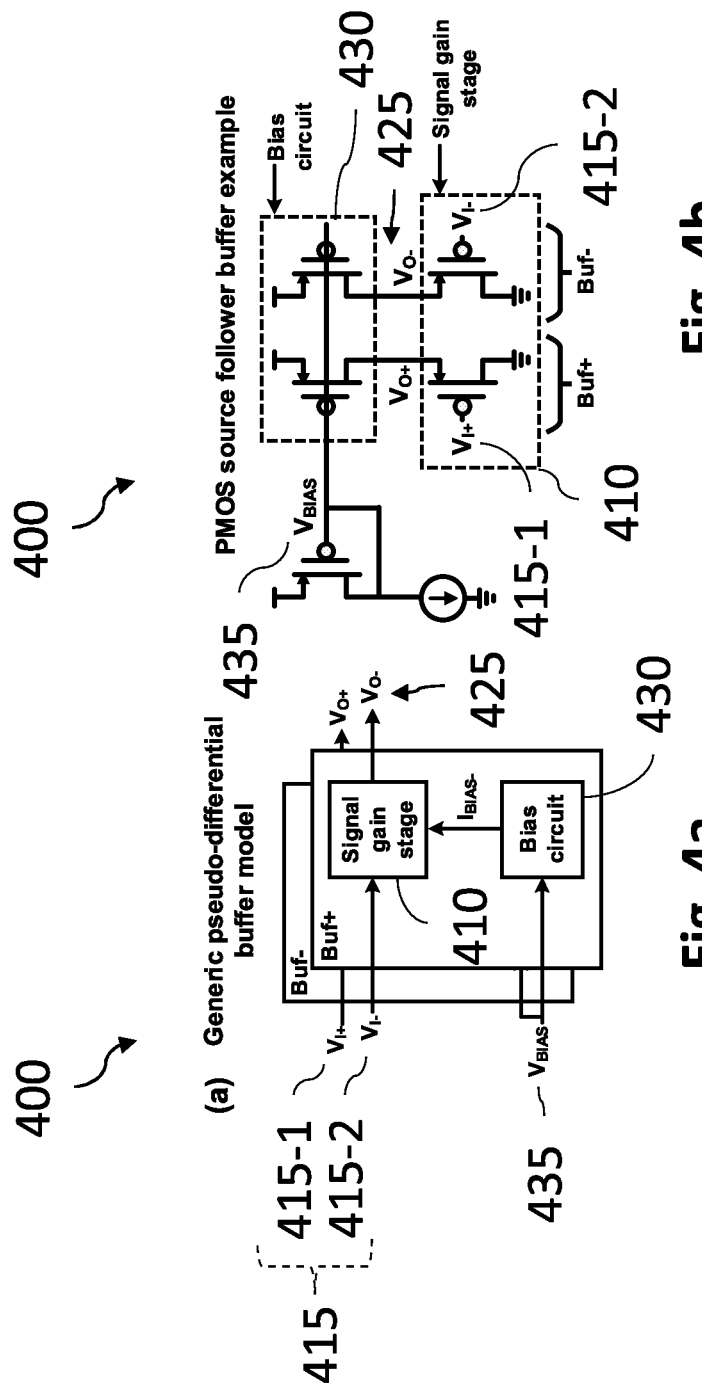

1200 in a calibration mode of an ADC, outputting a first output signal by sampling a calibration signal based on a first clock signal and at least a second clock signal ∼1210 determining a first mismatch between the phase shift and a predetermined phase shift based on the first output signal ∼1220 in an operation mode of the ADC, outputting a second output signal by sampling one of a biased input signal or a second calibration signal based on at least one of the first clock sig-nal and the second clock signal ∼1230 determining a second mismatch between the phase shift and the predetermined phase shift based on the second output signal ∼1240 calibrating the ADC based on the first and the second mismatch ∼1250

Fig. 12

ANALOG-TO-DIGITAL CONVERTER, RECEIVER, BASE STATION, MOBILE DEVICE AND METHOD FOR A TIME-INTERLEAVED ANALOG-TO-DIGITAL CONVERTER

BACKGROUND

Time-interleaving in analog-to-digital converters (ADCs) enables an increase of the data rate. However, timing mismatches among the clock signals impose a limit to the signal-to-noise ratio of the ADCs.

Hence, there may be a demand for improved analog-to-digital conversion.

BRIEF DESCRIPTION OF THE FIGURES

Some examples of apparatuses and/or methods will be described in the following by way of example only, and with reference to the accompanying figures, in which

FIG. 3a to FIG. 3c illustrate a third example of an ADC in a calibration mode and during two different time periods in an operation mode of the ADC.

FIG. 4a and FIG. 4b illustrate a first example of an input buffer circuit;

FIG. 12 illustrates an example of a method for a time-interleaved ADC.

DETAILED DESCRIPTION

Figure 1A:
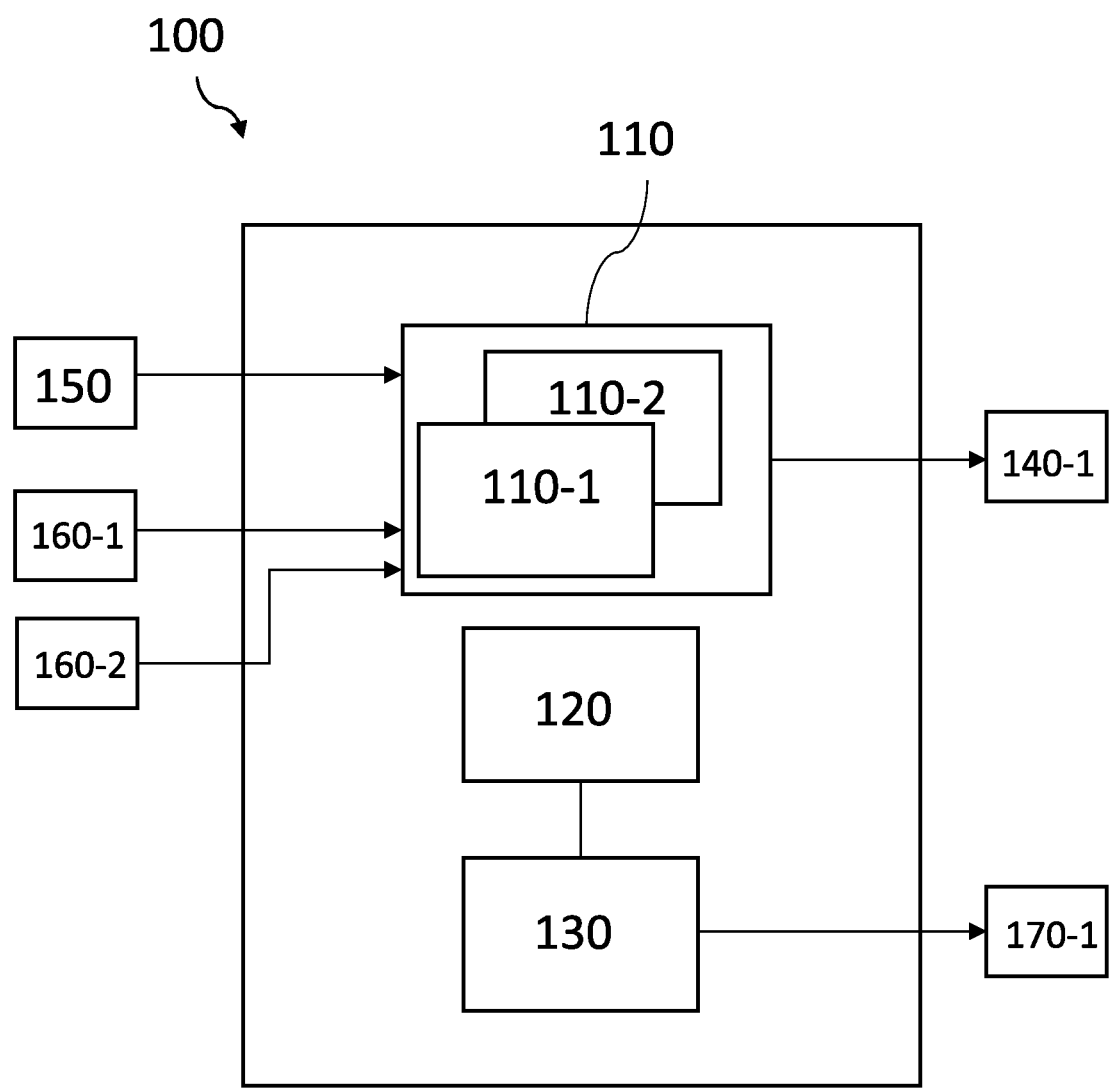
FIG. 1a and FIG. 1b illustrate a first example of an ADC in a calibration mode and in an operation mode, respectively.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Figure 1B:
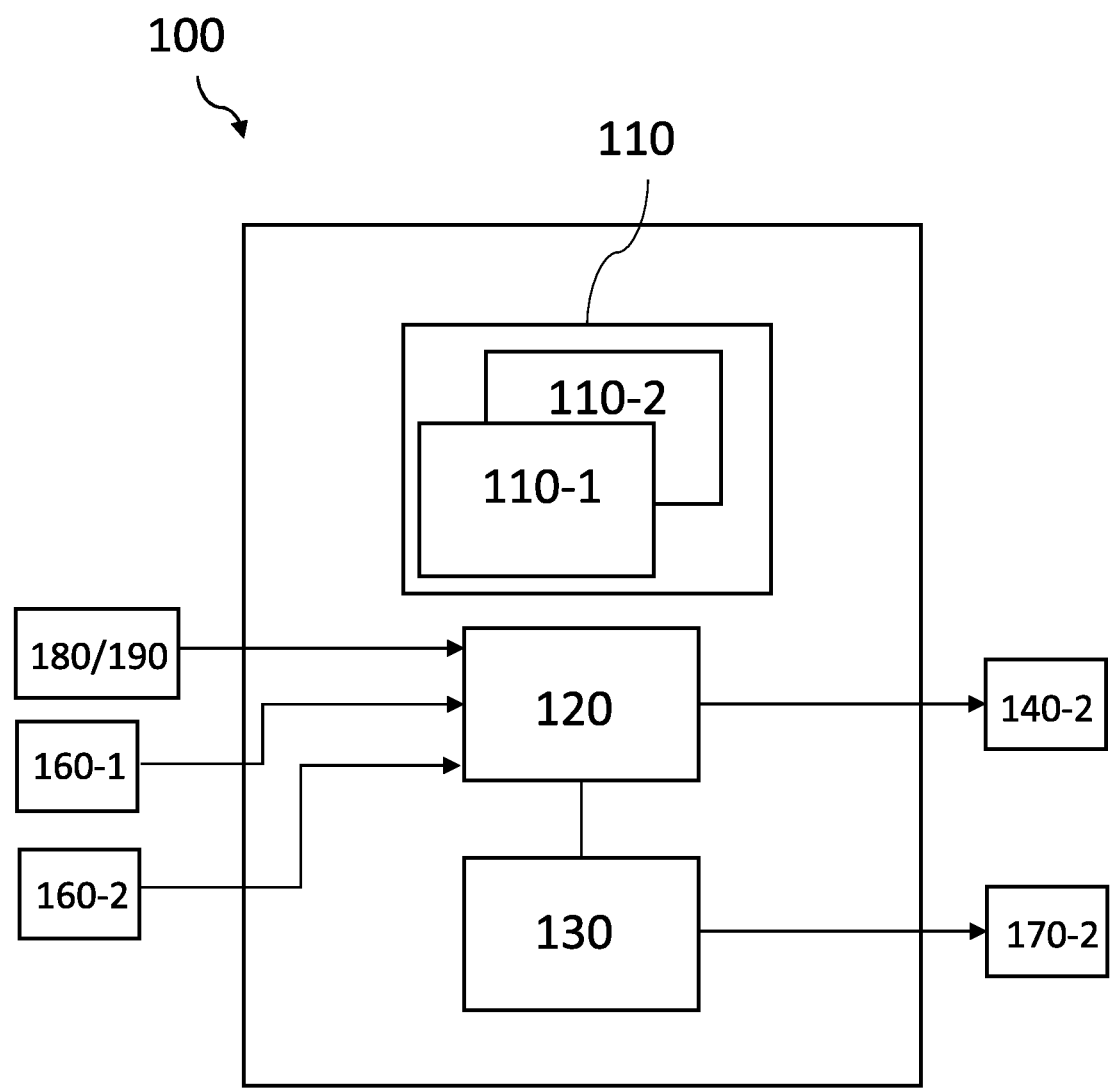

FIG. 1a and FIG. 1b illustrate a first example of an ADC 100 in a calibration mode and an operation mode of the ADC 100, respectively. The operation mode may be understood as a configuration of the ADC 100 in which the ADC 100 is intended to process an analog input signal (e.g., a biased input signal). In the operation mode, the ADC 100 may be configured to output a digital signal by sampling the analog input signal. A calibration process may be performed during the operation mode (in the background) which may allow the ADC 100 to run the signal processing in parallel without interruption. This calibration process may be understood as background or online calibration process.

The calibration mode may be understood as a configuration of the ADC 100 in which the ADC 100 is configured to sample a calibration signal and the ADC 100 is therefore "offline", i.e., the ADC 100 does not process any other signal but the calibration signal. This may be due to the input signal path being occupied by the calibration signal. For instance, the intended operation of the ADC 100 may be temporarily interrupted for injecting the calibration signal. Alternatively or additionally, the calibration mode may be active during an initial start-up, an initialization or reset of the ADC 100, e.g., before the ADC 100 is being put into operation the first time. The latter calibration process may be understood as foreground or offline calibration process.

The ADC 100 comprises multiple time-interleaved sub-ADCs 110. In some examples, the ADC 100 comprises at least one time-interleaved sub-ADC(s) 110. For illustrative purposes, there are two sub-ADCs shown in FIG. 1a and FIG. 1b, a first sub-ADC 110-1 and a second sub-ADC 110-2. In other examples, there may be any number n≥2 of sub-ADCs 110. The time-interleaving of the sub-ADCs 110 may be realized by providing clock signals with predefined phase relationships to each other for sampling incoming data at different times. Time-interleaving may be beneficial for highspeed applications to increase the data rate by combining the outputs of multiple sub-ADCs operating at a lower data rate.

The ADC 100 further comprises a detection circuit 120 and a calibration circuit 130. The detection circuit 120 and the calibration circuit 130 may be any electronic circuits, e.g., integrated into the ADC 100. In some examples, the detection circuit 120 may comprise at least one reference sub-ADC and/or at least one phase detector. For instance, the detection circuit 120 may comprise, in some examples, at least one reference sub-ADC and at least one phase detector, in other examples, at least two reference sub-ADCs or, in yet other examples, at least two phase detectors. In some examples, an output of the detection circuit 120 is input to the calibration circuit 130 (drives the calibration circuit 130).

The reference sub-ADC may, e.g., be a replica circuit of at least one of the sub-ADCs 110, i.e., a circuit which simulates the behavior of the sub-ADCs 110. The phase detector may, e.g., be a phase comparator configured to generate a signal representing a difference in phase between two signal inputs.

The sub-ADCs 110 are configured to, when the ADC 100 is in the calibration mode (FIG. 1a), generate (output) a first (output) signal 140-1 by sampling a (first) calibration signal 150 based on a first clock signal 160-1 and at least a second clock signal 160-2. For example, each of the sub-ADCs 110 may receive a respective clock signal for sampling the calibration signal 150. The first sub-ADC 110-1 may, e.g., receive the first clock signal 160-1, and the second sub-ADC 110-2 may, e.g., receive the second clock signal 160-2 for sampling the calibration signal 150. The first output signal 140-1 may be based on respective output signals of each of the sub-ADCs 110.

The calibration signal 150 may be an at least partially known test signal, e.g., a test signal with a known amplitude and frequency.

The first clock signal 160-1 comprises (exhibits) a phase shift relative to the second clock signal 160-2. In FIG. 1a and FIG. 1b, the first clock signal 160-1 and the second clock signal 160-2 are shown for illustrative purposes. In other examples, there may be a different number of clock signals than the one shown in FIG. 1a and FIG. 1b: There may be a number m≥2 of clock signals (including the first and second clock signal 160-1, 160-2). Each of the clock signals may exhibit a phase shift relative to another one of the clock signals, for instance.

The calibration circuit 130 is configured to determine a first mismatch 170-1 between the phase shift and a phase shift threshold (a predetermined phase shift) based on the first output signal 140-1. The predetermined phase shift may be the desired phase shift intended for the time-interleaving of the sub-ADCs 110. The predetermined phase shift may be any phase shift, e.g. a phase shift >0° or between 0° and 180°, which may be set, e.g., during production or design of the ADC 100. For instance, the predetermined phase shift may be set by a selection and/or configuration of at least one clock source providing the clock signals 160-1, 160-2. There may be a respective predetermined phase shift between each of the multiple sub-ADCs 110. For instance, the predetermined phase shift may be derivable from $\theta_i = 2\pi(i-1/n)$, where $\theta_i$ is a phase in radians for a clock signal to be received by sub-ADC i of the multiple sub-ADCs 140 and n is a number of sub-ADCs 110.

The first mismatch 170-1 may indicate an undesired clock skew (timing skew) between the first and second clock signal 160-1, 160-2. For example, the clock skew may be due to systematic and/or random clock mismatches, due to any non-ideality (e.g., manufacturing variations or voltage/temperature drift) of (active) elements (e.g., active elements generating the clock signals 160-1, 160-2) or due to propagation delays in the signal routing of the clock signals 160-1, 160-2.

Clock skew among clock phases may cause an error in the sampled output, e.g., generating spurious tones in the ADC output spectrum which degrades the signal-to-noise ratio of the ADC 100. This may be a critical performance bottleneck in highspeed applications, where clock skew of only 100 fs (femtoseconds) may limit the achievable ADC resolution to 7 b (bit) for a 20 GHz (gigahertz) input signal. Therefore, an objective of the ADC 100 may be to estimate the clock skew to enable compensation thereof.

Since the calibration signal 150 may be at least partially known, the first output signal 140-1 may be compared to an expected output signal to determine the first mismatch 170-1. For example, a value difference between the respective output signal (of the first output signal 140-1) of each of the sub-ADCs 110 and a corresponding expected output may indicate the first mismatch 170-1. The calibration circuit 130 may determine the first mismatch 170-1 based on any clock skew detection technique.

In some examples, the calibration circuit 130 is configured to determine the first mismatch 170-1 by determining a zero crossing index of the first output signal 140-1. The zero crossing index may indicate a signal slope of the calibration signal 150. Since a mean of the signal slope may be substantially constant, variations in the signal slope may be attributed to clock skew. The zero crossing index may be determined by, e.g., detecting the Most Significant Bit (MSB) transition between two consecutive interleaved samples. The latter may provide a 1-bit quantized value of the absolute signal slope. The signal slope may be averaged over a certain number of samples to estimate the clock skew with a certain accuracy. The clock skew detection based on the zero crossing index may be advantageous since—unlike with conventional clock skew detection methods—a highly-accurate (substantially error-free) reference clock signal at the ADC sampling rate is not necessarily required. Such highly accurate reference clock signal may, especially, be difficult to generate for sampling rates above 20 GS/s (giga samples per second). Thus, determining the zero crossing index may reduce the complexity of clock skew detection.

Further, the detection circuit 120 is configured to, when the ADC 100 is in the operation mode (FIG. 2b), generate (output) a second (output) signal 140-2 by sampling one of a biased (input) signal 180 to be received (and e.g., sampled) by the sub-ADCs 110 or a second calibration signal 190 based on at least one of the first clock signal 160-1 and the second clock signal 160-2. For example, the detection circuit 120 may receive the first clock signal 160-1 for sampling the biased input signal 180 or the second calibration signal 190 and, subsequently, receive the second clock signal 160-1. Alternatively, in case the detection circuit 120 comprises multiple reference circuits/phase detectors, each of these elements may receive a respective clock signal. In case the detection circuit 120 comprises at least one phase detector, the second output signal 140-2 may indicate a difference in phase between the first/second clock signal 160-1, 160-2 and the biased input signal 180/the second calibration signal 190. The (first) calibration signal 150 and the second calibration signal 190 may, in some examples, be the same signal or based on the same calibration clock signal.

In the operation mode, the sub-ADCs 110 may be further configured to sample the biased input signal 180 based on the first clock signal 160-1 and the second clock signal 160-2, e.g., in parallel to the sampling by the detection circuit 120. For instance, the detection circuit 120 and the sub-ADCs 110 may, e.g., be coupled to the same clock signal source generating the first clock signal 160-1 and the second clock signal 160-2.

In the case that the biased input signal 180 is input to the detection circuit 120, the detection circuit 120 and the sub-ADCs 110 may, e.g., be coupled to the same node generating/receiving the biased input signal 180. This may be beneficial since no additional calibration signal is required. The alternative of inputting the second calibration signal 190 to the detection circuit 180 may be beneficial since no additional load is added to the input signal path. The latter may be especially relevant for high-speed applications.

The calibration circuit 130 is configured to determine a second mismatch 170-2 between the phase shift and the predetermined phase shift based on the second output signal

140-2. The second mismatch 170-2 may indicate a (further) undesired clock skew between the first and second clock signal 160-1, 160-2.

The calibration circuit 130 may determine the second mismatch 170-2 based on any clock skew detection technique, e.g., based on digital estimators (e.g., by detecting spurs at certain frequencies of the biased input signal 180/second calibration signal 190), by cross-correlating the output of the sub-ADCs 110 and the second output signal 140-2 of the detection circuit 120 or by detecting asymmetries in the second output signal 140-2 (e.g., by mixing the output signals of different channels of the detection circuit 120).

In some examples, the calibration circuit 130 is configured to determine the second mismatch 170-2 by determining a zero crossing index of the second output signal 140-2. The zero crossing index may be determined by, e.g., detecting the Most Significant Bit (MSB) transition between two consecutive interleaved samples. The clock skew detection based on the zero crossing index may be advantageous since a highly-accurate reference clock signal at the ADC sampling rate is not necessarily required for generating the second calibration signal 190.

The calibration circuit 130 is further configured to calibrate the ADC 100 based on the first and the second mismatch 170-1, 170-2. For instance, the calibration circuit 130 may estimate the clock skew based on the first and the second mismatch 170-1, 170-2. In some examples, the calibration of the ADC 100 may further comprise a compensation of the estimated clock skew.

Since the first mismatch 170-1 and the second mismatch 170-2 may be determined based on different techniques (foreground and background calibration) and at different times, they may indicate different aspects of the clock skew which may be due to time-variant or temperature/voltage dependent parameters of the clock skew or to effects of differing signal paths for calibration in the calibration mode and the operation mode. Unlike conventional approaches, the ADC 100 may combine the use of foreground and background calibration and, hence, increase an accuracy of the overall calibration of the ADC 100.

In a conventional ADC, either foreground calibration or background calibration is implemented. On the one hand, foreground calibration may be useful during system start-up and provide a (one-time) correction of clock skew by injecting a specific test signal to the ADC input prior to operation (mode). As this may occupy the main ADC to detect timing errors, foreground operation (and correction) may be unsusceptible to mismatch and may (initially) be highly accurate. Foreground calibration may be however impractical for tracking any dynamic variation in the clock skew caused by supply voltage or temperature drift, generating residual error over time.

On the other hand, background calibration may (continuously) estimate clock skew while the ADC is running to track any drift in error due to voltage or temperature variation. For instance, clock skew may be background calibrated by operating a replica sub-ADC in parallel with the main ADC, allowing the replica ADC's samples to be correlated with the sub-ADC samples to estimate clock skew (timing errors). The detection circuit required for background calibration (e.g., a replica ADC) may be unaligned with the main ADC, and any mismatch between the (main) sub-ADCs and the detection circuit (or between their signal paths) may introduce systematic error in the clock skew detection which degrades performance. This may require careful layout and large, power-hungry devices to improve matching. At higher data rates targeting larger signal bandwidths, clock skew may significantly limit the achievable SNDR (Signal-to-noise and distortion ratio) of a conventional ADC. These speeds may also require larger time-interleaving factors, thus, a higher number of sub-ADCs which, in turn, may lead to higher mismatch variance. As a result, conventional background calibration may be insufficient for ADCs, especially, for those that require 10s of GHz bandwidth.

By contrast, the ADC 100 as described herein may combine background and foreground calibration for improving clock skew detection. The proposed calibration technique may use a foreground calibration loop to estimate systematic mismatch between the main sub-ADCs 110 and the replica phase detectors 120 (e.g., 1 b ADCs) used in a background calibration loop. This may be especially relevant for highspeed baud-rate ADCs which are one of the key building blocks in state-of-the-art receivers for both wireless and wireline communications, for instance. With data rates increasing beyond 100 Gb/s, these receivers may require time-interleaved ADCs with sample rates above 50 GS/s, where timing mismatch is a critical performance bottleneck. The ADC 100 may provide a more accurate and fully-integrated calibration technique which is suitable for such receivers. The ADC 100 may also exhibit low power overhead and relaxed hardware matching requirements.

In some examples, the calibration circuit 130 is further configured to determine a difference between the first mismatch 170-1 and the second mismatch 170-2 and calibrate the ADC 100 based on the difference. For instance, the ADC 100 may take advantage of the foreground calibration by initializing the background calibration based on the difference between their outputs. This difference may be due to mismatch between the signal path (path from clock signal source to sub-ADCs 110) and calibration path (path from clock signal source to detection circuit 120). This mismatch may be corrected by applying a digital offset to the input of the calibration logic, allowing the background calibration to converge to the first mismatch 170-1 (codes) determined during foreground calibration. From this point, the background calibration may track (absolute) voltage and temperature variations in clocking more accurately.

In some examples, the calibration circuit 130 is configured to determine the second mismatch 170-2 within a predefined time period after starting the operation mode. Alternatively, the calibration circuit 130 may be configured to determine the second mismatch 170-2 within a predefined time period after having determined the first mismatch 170-1 (or vice versa). The calibration circuit 130 may further be configured to determine a third mismatch between the phase shift and the predetermined phase shift based on the second output signal after the predefined time period and calibrate the ADC 100 based on the third mismatch.

For instance, the calibration mode may be performed before the operation mode, e.g., during initialization of the ADC 100, and the second mismatch 170-2 may be determined shortly after the operation mode has started. Then, the difference between the first and second mismatch 170-1, 170-2 may be substantially attributed to mismatches between the signal path and the calibration path since dynamic variations of the clock skew may be negligible if the predefined time period is sufficiently short. This difference may be used to align the signal path and the calibration path for background calibration. For example, the signal path and the calibration path may be aligned by adapting the output of the reference circuit 120 such that it converges to the first mismatch 170-1, e.g., shortly after having started the operation mode. After alignment, the calibration circuit 130 may determine the third mismatch for calibration of the clock signals. In this manner, the ADC 100 may enable more accurate clock skew measurements during background calibration by reducing mismatches between the signal path and the calibration path.

The calibration circuit 130 may further be configured to compensate a clock skew of at least one of the first and the second clock signal 160-1, 160-2 based on the first and the second mismatch 170-1, 170-2, and optionally, based on the third mismatch. The calibration circuit 130 may apply any clock skew compensation technique such as mixed-signal, analog or digital domain clock skew compensation. For example, clock skew may be adjusted in the analog domain by, e.g., using delay circuits (digital-to-time converters, DTCs) to control a delay of each sampling pulse (of the first and second clock signal 160-1, 160-2), while the DTC code (i.e., the control parameter for adjusting the delay generated by the DTC) may be determined in the digital domain based on estimates of the clock skew (based on the first and second mismatch 170-1, 170-2).

In some examples, the calibration circuit 130 comprises at least one delay circuit configured to calibrate the ADC 100 by delaying at least one of the first and the second clock signal 160-1, 160-2 based on the first and the second mismatch 170-1, 170-2. In some examples, the delay circuit may be set such that at least one of the clock signals 160-1, 160-2 is delayed based on the third mismatch and a difference between the first and the second mismatch 170-1, 170-2 during operation mode. Alternatively, the calibration circuit 130 may comprise a digital filter configured to compensate the first and the second mismatch 170-1, 170-2, and optionally the third mismatch.

In some examples, the ADC 100 further comprises a ring oscillator configured to generate a calibration clock signal. At least one of the calibration signal and the second calibration signal may be based on the calibration clock signal. The ring oscillator may be any device for outputting oscillations based on a ring of inverters. For instance, the ring oscillator may comprise an odd number of NOT gates coupled to each other in a chain, and an output of the last NOT gate of the chain may be fed back into the first NOT gate.

The ring oscillator may be used for providing an irrational ratio between the frequency of the first/second calibration signal ($f_{in}$) and the sampling frequency ($f_s$) of the clock signals 160-1, 160-2 such that $f_{in}$ is uncorrelated to the ADC sample rate. An irrational ratio may be beneficial for clock skew detection based on the zero crossing index (especially during background calibration), as described above. In other examples, the ADC 100 may comprise any other oscillator or clock source to generate the calibration clock signal. For instance, the ADC 100 may comprise a phase-locked loop (PLL) or an LC (inductor L, capacitor C) oscillator (e.g., a resonant circuit) to generate the calibration clock signal.

Figure 2:
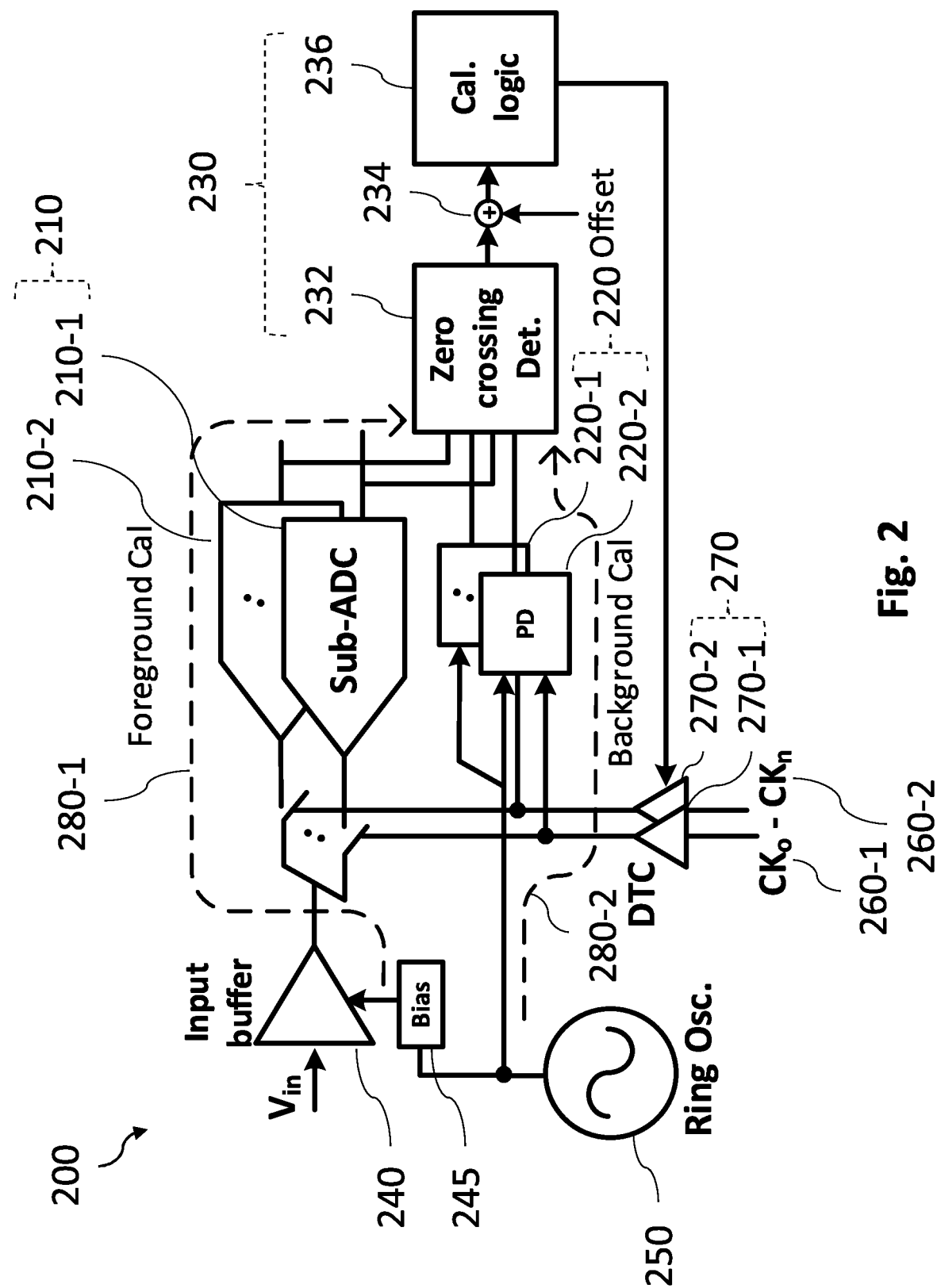
FIG. 2 illustrates a second example of an ADC.

FIG. 2 illustrates a second example of an ADC 200. The ADC 200 comprises multiple time-interleaved sub-ADCs 210. For illustrative purposes, two sub-ADCs, a first sub-ADC 210-1 and a second sub-ADC 210-2 are illustrated in FIG. 2. In other examples, the ADC 200 may comprise any number n≥2 of sub-ADCs 210.

The ADC 200 further comprises a detection circuit 220. For illustrative purposes, the detection circuit 220 comprises two phase detectors, a first phase detector 220-1 and a second phase detector 220-2 (e.g., 1-bit phase detectors) are illustrated in FIG. 2. In other examples, the detection circuit 220 may comprise any number k≥1 of phase detectors. Alternatively, the detection circuit 220 may comprise any number p≥1 of reference sub-ADCs, or any combination of phase detectors and reference sub-ADCs.

The ADC 200 further comprises a calibration circuit 230. The calibration circuit 230 comprises a first logical circuit 232 for determining zero crossings which is coupled to the output of the sub-ADCs 210 and the output of the detection circuit 220. The calibration circuit 230 further comprises a second logical circuit 236 for determining phase mismatches and an (optional) logical SUM gate 234 coupled to the output of the first logical circuit 232 and to the input of the second logical circuit 236. The first logical circuit 232 may process a signal received from the sub-ADCs 210 or the detection circuit 220, upstream to the second logical circuit 236.

The ADC 200 further comprises an input buffer circuit 240 comprising an input node configured to, when the ADC 200 is in an operation mode, receive an input signal. The input buffer circuit 240 further comprises a bias node 245 configured to receive a bias signal. An output of the input buffer circuit 240 is coupled to an input of the sub-ADCs 210 and an input of the detection circuit 220. An input of the bias node 245 is further coupled to a ring oscillator 250.

In other examples than the one shown in FIG. 2, the bias node 245 may be coupled to any other oscillator or clock source as alternative to the ring oscillator 250. The ring oscillator 250 is configured to generate a calibration clock signal.

The ADC 200 is configured to receive a first clock signal 260-1 ($CK_0$) and at least a second clock signal 260-2 ($CK_N$). The clock signals 260-1 and 260-2 are received at a respective clock signal node of the ADC 200 coupled to the input of a respective one of the sub-ADCs 210 and the input of a respective one of the phase detectors 220-1, 220-2. The first clock signal 260-1 exhibits a phase shift relative to the second clock signal 260-2.

The ADC 200 further comprises a delay circuit 270 comprising two digital-to-time converters 270-1, 270-2, each coupled to a respective one of the clock signal nodes.

The sub-ADCs 210 are configured to, when the ADC 200 is in a calibration mode, output a first output signal by sampling a calibration signal based on the first clock signal 260-1 and the at least one second clock signal 260-2. The calibration signal (buffer output) may be generated by the input buffer circuit 240. For instance, the calibration signal may be injected into a first signal path 280-1 (data path) which routes signals from the input buffer circuit 240 to the calibration circuit 230 via the sub-ADCs 210. In some examples, the input buffer circuit 240 is configured to receive a calibration clock signal (e.g., from the ring oscillator 250) and, when the ADC 200 is in the calibration mode, generate the calibration signal based on the calibration clock signal and the bias signal.

In some examples, the input buffer circuit 240 comprises at least one source follower. A first terminal of the source follower may be coupled to the bias node 245 and a clock node configured to receive the calibration clock signal. A second terminal of the source follower may be coupled to the input node.

In conventional ADCs, a calibration signal may be injected (e.g., added) through a multiplexer at an ADC input node, which may add parasitics to the bandwidth-critical signal path, or through a transmitter of an input buffer circuit of the conventional ADC, which may complicate system-level design. By contrast, the ADC 200 may provide the calibration signal through the bias node 245 and therefore reduce bandwidth limitations on the signal path.

The calibration circuit 230 is configured to determine a first mismatch between the phase shift and a predetermined phase shift based on the first output signal. The calibration circuit 230 may determine the first mismatch by determining a zero crossing index of the first output signal. For instance, the first logical circuit 232 may determine the number of zero crossings of the first output signal, and the second logical circuit 236 may determine the zero crossing index by statistically processing the detected zero crossings and estimating the clock skew based on the zero crossing index.

The detection circuit 220 is configured to, when the ADC 220 is in an operation mode, output a second output signal by sampling a second calibration signal based on at least one of the first clock signal 260-1 and the second clock signal 260-2. The second calibration signal is based on the calibration clock signal generated by the ring oscillator 250. The detection circuit 220 may, e.g., comprise two phase detectors configured to output a phase difference between the first clock signal 260-1 and the second clock signal 260-2 ($CK_0$–$CK_1$) and a phase difference between the second clock signal 260-2 and the first clock signal 260-1 ($CK_1$–$CK_0$), respectively.

The ring oscillator 250 may, for example, generate the calibration clock signal such that a frequency of the calibration signal and/or the second calibration signal is uncorrelated to the frequency of the first and second clock signal 260-1, 260-2 (irrational $f_{in}/f_s$). The calibration clock signal may be input to the bias node 245 of the input buffer circuit 240 to support foreground calibration or to the detection circuit 220 to support background calibration.

The calibration circuit 230 is further configured to determine a second mismatch between the phase shift and the predetermined phase shift based on the second output signal and calibrate the ADC 200 based on the first and the second mismatch. The calibration circuit 230 may determine the second mismatch by determining a zero crossing index of the second output signal. The calibration circuit 230 may further be configured to calibrate the ADC 200 by delaying at least one of the first and the second clock signal 260-1, 260-2 based on the first and the second mismatch, e.g., by controlling the delay circuit 270 accordingly.

In some examples, the calibration circuit 230 is further configured to determine a difference between the first mismatch and the second mismatch and calibrate the ADC 200 based on the difference, e.g., by adjusting an offset which is input to the logical SUM gate 234. This may align the first signal path 280-1 with a second signal path 280-2 (clock path or detection path) which routes signals from the ring oscillator 250 to the calibration circuit 230 via the detection circuit 220. The signal paths 280-1, 280-2 both receive the clock signals 260-1, 260-2. The differing routings may cause mismatches in clocking between the signal paths 280-1, 280-2. The first mismatch may, e.g., be a sub-ADC path mismatch, and the second mismatch may, e.g., be a detection path mismatch. The first and the second mismatch may be determined, e.g., within a short time period such that varying influences on the time skew are negligible and the difference between the first and the second mismatch substantially indicate the signal path misalignments.

In some examples, the calibration circuit 230 is configured to determine the second mismatch within a predefined time period after starting the operation mode, determine a third mismatch between the phase shift and the predetermined phase shift based on the second output signal (or a third output signal of the detection circuit 220) after the predefined time period and calibrate the ADC 200 based on the third mismatch (e.g., by delaying the clock signals 260-1, 260-2).

For instance, the difference between the first and the second mismatch may be used to set the offset input to the logical SUM gate 234, and the third mismatch may be determined by the second logical circuit 236 when the offset is set. The third mismatch may, thus, indicate the "real" clock skew as if the first and second signal paths 280-1, 280-2 were substantially aligned. By delaying the clock signals 260-1, 260-2 based on the third mismatch, signal routing mismatches as well as clock skew due to voltage or temperature drift may be reduced or compensated.

The ADC 200 may provide a fully integrated solution combining foreground and background calibration for precise clock skew correction.

Figure 3A:
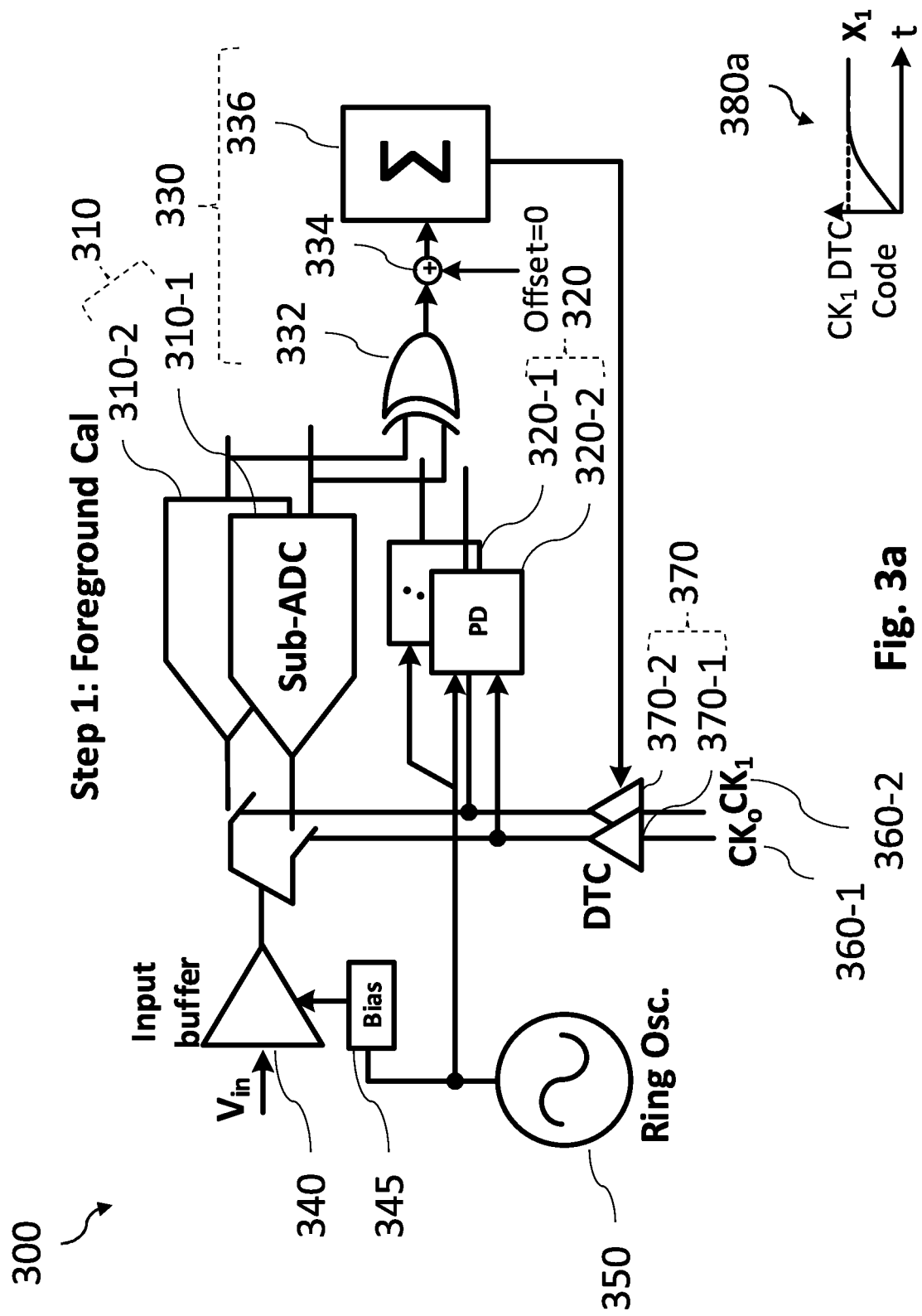
Figure 3B:
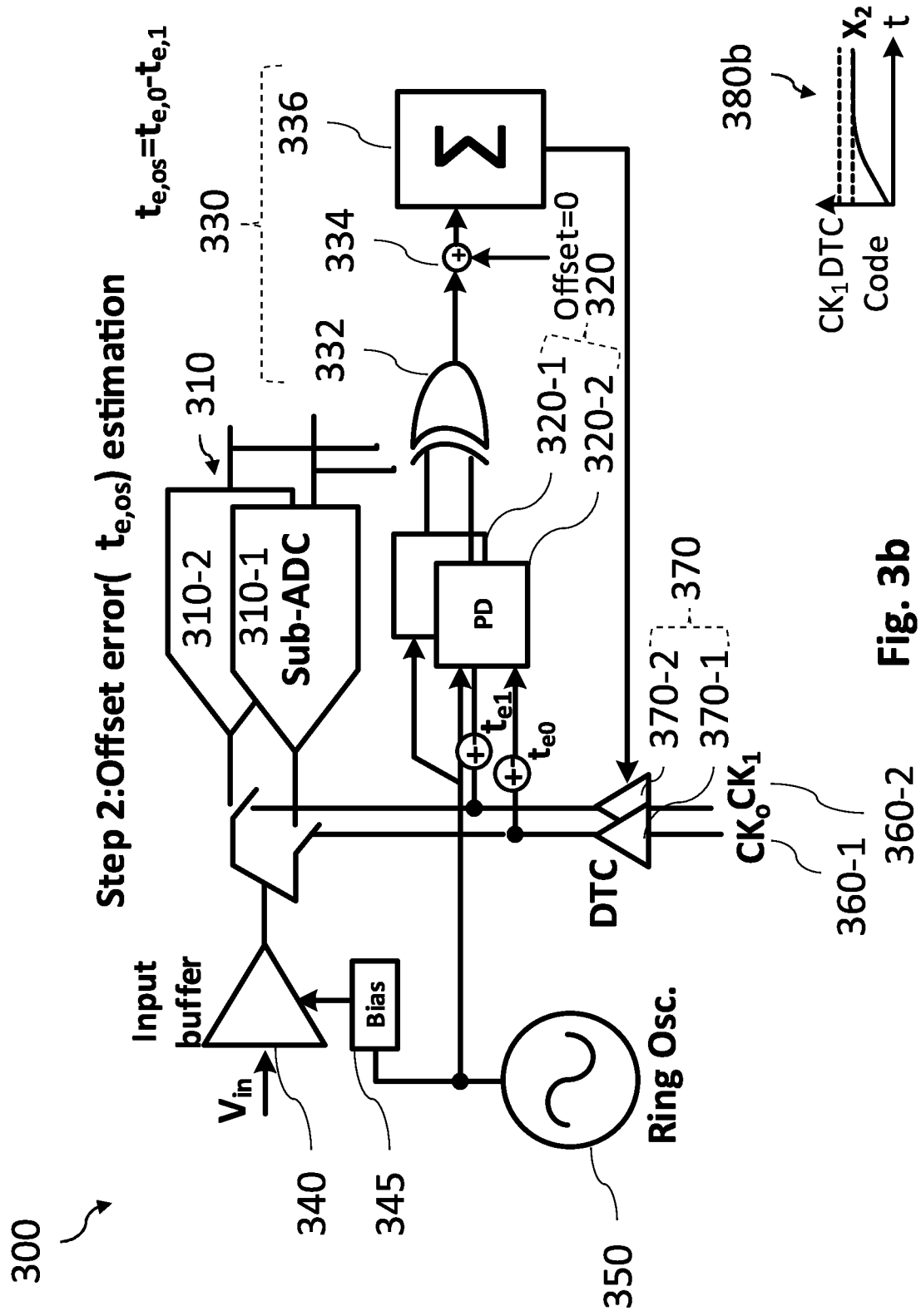

FIG. 3a to FIG. 3c illustrate a third example of an ADC 300 in a calibration mode (FIG. 3a) and during two different time periods (FIG. 3b and FIG. 3c, respectively) in an operation mode of the ADC 300.

The ADC 300 comprises multiple time-interleaved sub-ADCs 310 (e.g., sub-ADCs 310-1 and 310-2) and a detection circuit 320 comprising at least one phase detector (e.g., phase detectors 320-1 and 320-2). The ADC 300 further comprises a calibration circuit 330. The calibration circuit 330 comprises a first logical circuit 332 for determining zero crossings which is coupled to the output of the sub-ADCs 310 and the output of the detection circuit 320. In the example shown in FIG. 3a to FIG. 3c, the first logical circuit 332 comprises a XOR gate which may be used to determine the zero crossings of a MSB of an input to the calibration circuit 330.

The calibration circuit 330 further comprises a second logical circuit 336 for determining phase mismatches and an (optional) logical SUM gate 334 coupled to the output of the first logical circuit 332 and to the input of the second logical circuit 336. The first logical circuit 332 may process a signal received from the sub-ADCs 310 or the detection circuit 320, upstream to the second logical circuit 336.

The ADC 300 further comprises an input buffer circuit 340 comprising an input node configured to, when the ADC 300 is in an operation mode, receive an input signal. The input buffer circuit 340 further comprises a bias node 345 configured to receive a bias signal. An output of the input buffer circuit 340 is coupled to an input of the sub-ADCs 310 and an input of the detection circuit 320. An input of the bias node 345 is further coupled to a ring oscillator 350. The ring oscillator 350 is configured to generate a calibration clock signal.

The ADC 300 is configured to receive a first clock signal 360-1 ($CK_0$) and at least a second clock signal 360-2 ($CK_1$). The clock signals 360-1 and 360-2 are received at a respective clock signal node of the ADC 300. The clock signal nodes are coupled to the input of a respective one of the sub-ADCs 310 and the input of a respective one of the phase detectors of the detection circuit 320. The first clock signal 360-1 exhibits a phase shift relative to the second clock signal 360-2.

The ADC 300 further comprises a delay circuit 370 comprising two digital-to-time converters (DTC) 370-1, 370-2, each coupled to a respective one of the clock signal nodes.

The sub-ADCs 310 are configured to, when the ADC 300 is in the calibration mode (FIG. 3a), output a first output signal by sampling a calibration signal based on the first clock signal 360-1 and the at least one second clock signal 360-2. The calibration signal may be generated by the input buffer circuit 340. For instance, the calibration signal may be injected into the input buffer circuit 340 via the bias node 345. In some examples, the input buffer circuit 340 is configured to receive a calibration clock signal (e.g., from the ring oscillator 350) and, when the ADC 300 is in the calibration mode, generate the calibration signal based on the calibration clock signal and the bias signal. The calibration clock signal may be input to the bias node 345 of the input buffer circuit 340 to support foreground calibration or to the detection circuit 320 to support background calibration.

The calibration circuit 330 is configured to determine a first mismatch (DTC code 380*a*) between the phase shift and a predetermined phase shift based on the first output signal. The calibration circuit 330 may determine the first mismatch by determining a zero crossing index of the first output signal. For instance, the first logical circuit 332 may determine the number of zero crossings of the first output signal, and the second logical circuit 336 may determine the zero crossing index by statistically processing the detected zero crossings and estimating the clock skew based on the zero crossing index.

In some examples, the ring oscillator 350 may, for example, generate the calibration clock signal such that a frequency of the calibration signal (and/or a second calibration signal) which are based on the calibration clock signal are uncorrelated to the frequency of the first and second clock signal 360-1, 360-2 (irrational $f_{in}/f_s$).

In the calibration mode (step 1, FIG. 3*a*), the detection circuit 320 and the detection path may be deactivated. Foreground calibration may be performed by coupling the ring oscillator 350 to the bias node 345 (bias line) of the input buffer circuit 340 (ADC input buffer) which may ensure that the frequency of the calibration signal (input signal frequency) has an irrational relationship with the frequency of the clock signals 360-1, 360-2 (sampling clock frequency). The foreground calibration loop may converge to the DTC code 380*a* of X1 for the first clock signal 360-1 ($CK_1$). Since the ADC 300 may be interrupted in its normal operation during calibration mode, the ADC 300 may be meanwhile unable to measure any other signal. Therefore, foreground calibration may be performed only temporarily, e.g., at certain times such as at the start-up of the ADC 300.

The calibration mode per se may be impractical for tracking clock skew (skew variation) due to voltage or temperature drift. After prolonged operation, there may be significant residue error that is limiting the performance of the ADC 300, especially, in high-speed applications. For instance, a 50 GS/s ADC may typically require a clock skew error <1 ps to maintain >6 effective bits resolution. Therefore, an objective of the technique described herein may be to improve dynamic tracking of the DTC delay based on background calibration.

The detection circuit 320 is configured to, when the ADC 320 is in an operation mode (FIG. 3*b* and FIG. 3*c*), output a second output signal by sampling a second calibration signal based on at least one of the first clock signal 360-1 and the second clock signal 360-2. The second calibration signal is based on the calibration clock signal generated by the ring oscillator 350.

The calibration circuit 330 is further configured to, during a first time period (step 2, FIG. 3*b*), determine a second mismatch (DTC code 380*b*) between the phase shift and the predetermined phase shift based on the second output signal and calibrate the ADC 300 based on the first and the second mismatch. The calibration circuit 330 may determine the second mismatch by determining a zero crossing index of the second output signal.

The calibration circuit 330 may further be configured to determine a difference between the first mismatch and the second mismatch during the first time period and calibrate the ADC 300 based on the difference, e.g., by adjusting an offset which is input to the logical SUM gate 334. This may align the signal path (path to sub-ADCs 310) with the detection path (path to detection circuit 320). The differing routings between the two paths may cause mismatches in clocking. The first and the second mismatch may be determined, e.g., within a short time period such that varying influences on the time skew are negligible and the difference between the first and the second mismatch substantially indicate the signal path misalignments.

In the first time period, the detection circuit 320 and the detection path (background calibration loop) may be activated. The background calibration may be based on zero crossing detection by using 1-bit phase detectors as replica ADCs, for instance. Layout-induced routing path delay mismatch (mismatch between the signal path and the detection path) and random mismatch among phase detector input offsets may result in additional timing error at the input of the phase detectors, labeled in FIG. 3*b* as $t_{e0}$ and $t_{e1}$ for $CK_0$ and $CK_1$, respectively. The background calibration loop of the ADC 300 may converge to the DTC code 380*b* of X2 which may be different to the DTC code 380*a* of the foreground calibration loop (X1). X1–X2 may be proportional to $t_{e,os} = t_{e1} - t_{e0}$. This may, conventionally, result in a residual error during background calibration. By contrast, the ADC 300 may enable calibration of this residual error.

The calibration circuit 330 may further be configured to calibrate the ADC 300 by delaying at least one of the first and the second clock signal 360-1, 360-2 based on the first and the second mismatch, e.g., by controlling the delay circuit 370 accordingly. For instance, the calibration circuit 330 may determine the residual error by determining a difference between the first and the second mismatch (X1-X2). The ADC 300 may, hence, allow to reduce (or cancel) the said residual error.

During the second time period (step 3, FIG. 3*c*), the calibration circuit 330 may calibrate the ADC 300 by delaying the clock signals 360-1, 360-2. For instance, the calibration circuit 330 may input an offset E1 to the logical SUM gate 334 and, thus, add E1 to the input of the second logical circuit 336 (accumulator) such that the calibration loop converges to X1. The DTC code 380*c* may be X1 equal to X2+k*E1, where k is a proportionality constant. E1 may be adjusted to force the DTC code 380*c* to converge to X1. Alternatively, an additional loop may be implemented which compares X2 to X1 and iteratively updates E1. In some examples, the calibration circuit 330 may adjust the offset once, e.g., after initialization of the ADC 300 (assuming $t_{e,os}$ is substantially static), and maintain it afterwards.

During typical operation of the ADC 300, the calibration loop may continuously run in the background and the offset may be kept at the value E1. The calibration circuit 330 may be configured to determine a third mismatch between the phase shift and the predetermined phase shift (based on the second output signal) and calibrate the ADC 300 based on the third mismatch. For an n-way time-interleaved ADC (an ADC with n sub-ADCs), a respective offset may be determined (e.g., separately) for each of n−1 calibration loops.

It is to be noted that FIG. 3*a* to FIG. 3*c* show a simplified ADC 300 with 2x time interleaving using clocks $CK_0$ and $CK_1$. For simplification, the delay in $CK_0$ is assumed as fixed in the example of FIG. 3a to FIG. 3c, while the delay of $CK_1$ is tuned for alignment to $CK_0$ using the DTC code. In other examples, there may be any number of clocks, and multiple clocks may be adjusted for compensation of the clock skew.

The ADC 300 may provide a combination of foreground and background calibration for precise clock skew correction.

FIG. 4a and FIG. 4b illustrate a block diagram and a circuit diagram of a first example of an input buffer circuit 400, respectively. The input buffer circuit 400 may be for an ADC as described herein, such as ADC 100, 200 or 300.

The input buffer circuit 400 comprises an input stage 410 (comprising an input node), e.g., a signal gain stage, configured to, when the ADC is in an operation mode, receive an input signal 415. In the examples shown in FIG. 4a and FIG. 4b, the input buffer circuit 400 is (pseudo-) differential, i.e., two input signals 415-1, 415-2 are received at the input stage 410. In other examples, the input buffer circuit 400 may exhibit any other buffer configuration, e.g., the input buffer circuit 400 may be a single-ended buffer circuit.

For instance, an external analog circuit coupled to the input buffer circuit 400 may be configured to supply the input signal 415 to the input buffer circuit 400.

The input buffer circuit 400 further comprises an output node configured to, when the ADC is in an operation mode, output a biased input signal 425 which is received by sub-ADCs of the ADC and, optionally, by a detection circuit of the ADC.

The input buffer circuit 400 further comprises a bias circuit 430 (comprising a bias node) configured to receive a bias signal 435. The biased input signal 425 may be based on the bias signal 435 and the input signal 415. The biased input signal 425 may be an amplified signal based on the input signal 415 and amplified by the input stage 410, for instance. In the latter case, the bias signal 435 may determine the amount of amplification.

The input buffer circuit 400 comprises two substantially identical branches with separate bias sources (left and right part of bias circuit 430 in FIG. 4b) and signal input stages (left and right part of input stage 410 in FIG. 4b). The input buffer circuit 400 comprises an exemplary PMOS-input source follower (FIG. 4b), which may be beneficial to drive high-bandwidth ADCs. The bias current sources in each branch of the bias circuit 430 may be biased identically during typical operation of the ADC. The source follower may be a common drain amplifier.

A calibration signal for calibrating the ADC, as described above, may be injected via the input signal 415. For instance, a switch on the signal path may be provided to inject the calibration signal during calibration mode of the ADC.

Figures 5A, 5B:
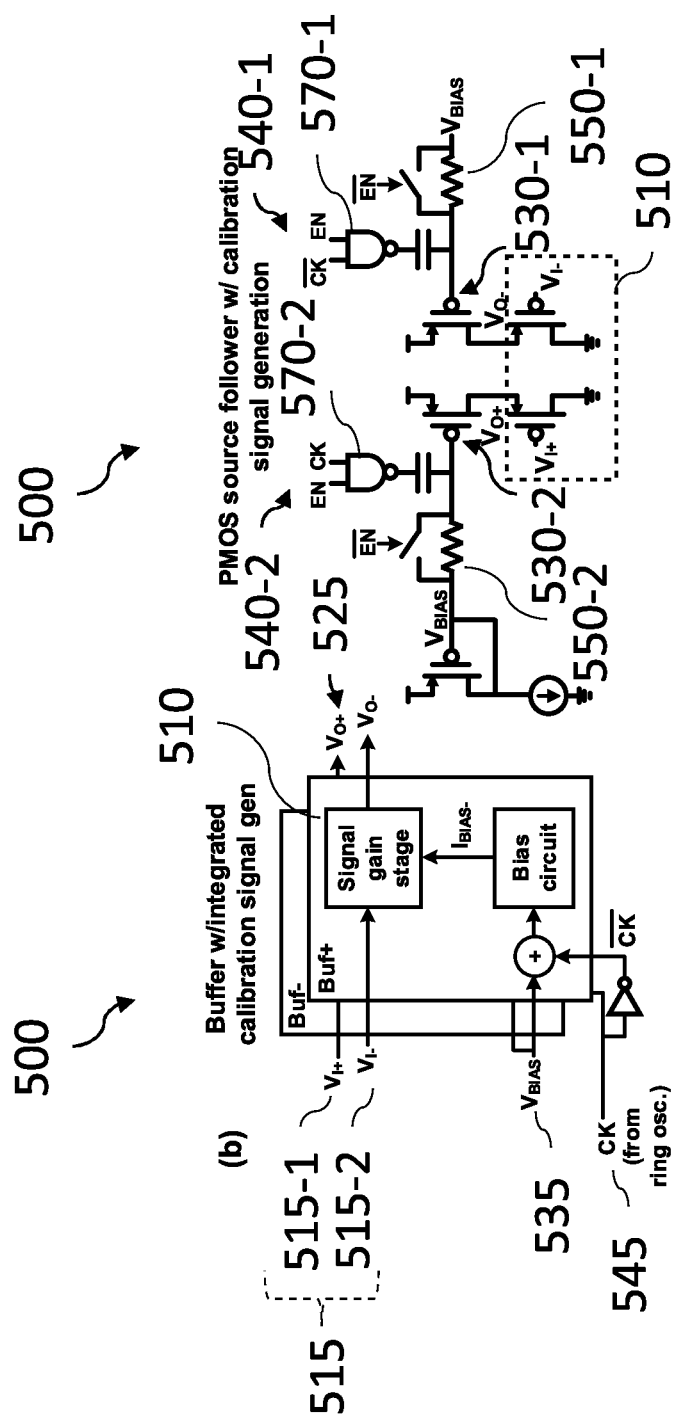
FIG. 5a to FIG. 5d illustrate a second example of an input buffer circuit.
Figure 5C:
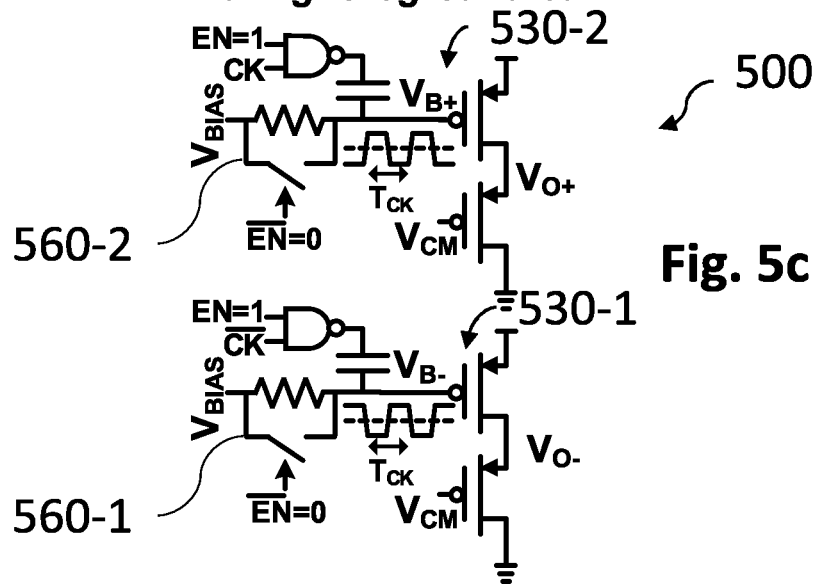
Figure 5D:
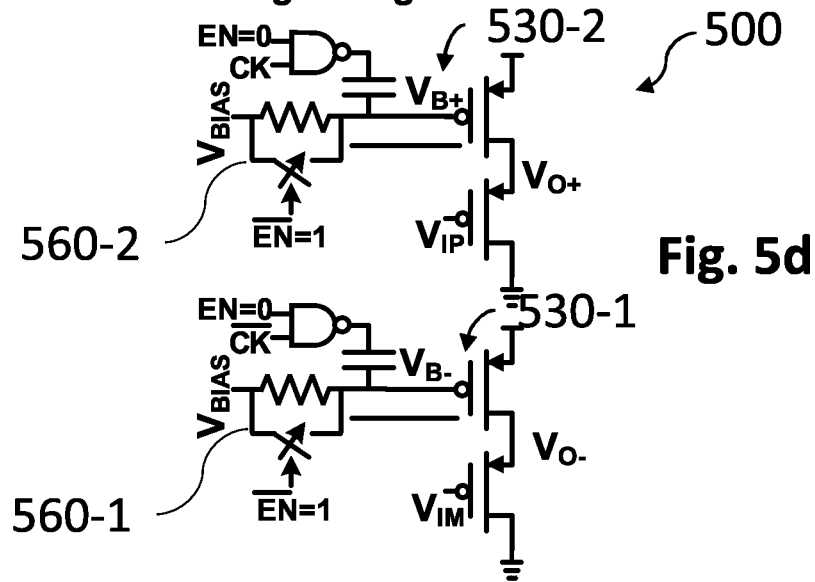

FIG. 5a and FIG. 5b illustrate a block diagram and a circuit diagram of a second example of an input buffer circuit 500, respectively. FIG. 5c and FIG. 5d illustrate an exemplary calibration mode and an exemplary operation mode of the second example of the input buffer circuit 500, respectively. The input buffer circuit 500 may be for an ADC as described herein, such as ADC 100, 200 or 300.

The input buffer circuit 500 comprises an input stage 510 (comprising an input node) configured to, when the ADC is in an operation mode, receive an input signal 515. In the examples shown in FIG. 5a and FIG. 5b, the input buffer circuit 500 is (pseudo-) differential, i.e., two input signals 515-1, 515-2 are received at the input stage 510. In the example shown in FIG. 5b, the input buffer circuit 500 comprises two source followers, one for the positive input signal 515-1 and one for the negative input signal 515-2. In other examples, the input buffer circuit 500 may exhibit any other buffer configuration, e.g., the input buffer circuit 500 may receive only a single input signal. The input buffer circuit 500 may be a voltage or a current buffer, for instance.

For instance, an external analog circuit coupled to the input buffer circuit 500 may be configured to supply the input signal 515 to the input buffer circuit 500.

The input buffer circuit 500 further comprises an output node configured to, when the ADC is in an operation mode, output a biased input signal 525 which is received by sub-ADCs of the ADC and, optionally, by a detection circuit of the ADC.

The input buffer circuit 500 further comprises two bias nodes configured to receive a bias signal 535 ($V_{Bias}$). The biased input signal 525 may be based on the bias signal 535 and the input signal 515.

The input buffer circuit 500 comprises two substantially identical branches with separate bias sources (upper left and right part of the input buffer circuit in FIG. 5b; bias nodes) and signal input stages (input stage 510). The input buffer circuit 500 comprises an exemplary PMOS source follower (FIG. 5b), which may be beneficial to drive high-bandwidth ADCs. In other examples, the input buffer circuit 500 may comprise any type of source follower (common drain amplifier), e.g., an NMOS source follower. The bias current sources in each branch of the buffer circuit 500 may be biased identically, e.g., by making the bias nodes substantially equal, during typical operation of the ADC.

The input buffer circuit 500 further comprises two clock nodes 540-1, 540-2. The clock nodes 540-1, 540-2 are configured to receive a calibration clock signal 545. The input buffer circuit 500 is configured to, when the ADC is in the calibration mode, generate a calibration signal based on the calibration clock signal 545 and the bias signal 535. For instance, the calibration signal may be generated by amplifying the calibration clock signal 545 based on the bias signal 535. In other examples, the input buffer circuit 500 may comprise any other number of clock nodes than shown in FIG. 5a and FIG. 5b (e.g., one clock node). The clock nodes 540-1, 540-2 may be coupled to a ring oscillator of the ADC to receive the calibration clock signal 545.

Each of the two source followers shown in FIG. 5b comprises a first terminal 530-1 and 530-2, respectively, which is coupled to a respective one of the bias nodes and a respective one of the clock nodes 540-1, 540-2. A second terminal of each of the source followers is coupled to the input stage 510.

A calibration signal for calibrating the ADC, as described above, may be injected via the clock nodes 540-1, 540-2. The calibration signal may be a differential test signal generated by AC coupling of an inverted calibration clock signal at the first terminal 530-1 (to one buffer branch) and a non-inverted calibration clock signal at the first terminal 530-2 (to the other buffer branch), i.e., the clock input to one of the buffers would be inverted relative to the other. This may involve adding the calibration clock signals 545 with opposite polarities to two terminals of the clock nodes 540-1, 540-2.

Adding a switch on the signal path may cause a reduction in bandwidth, while adding the switch for calibration on the bias path (e.g., the injection of the calibration clock signal 545 to the bias nodes 530-1, 530-2) as shown in FIG. 5a and FIG. 5b may decrease the capacitive loading and/or series resistance of the input buffer circuit 500 relative to the implementation in the input buffer circuit 400 (or substantially add no capacitive loading or resistance to the signal path) and, hence, reduce bandwidth limitations of the ADC.

The first terminal 530-1, 530-2 of each of the source followers is coupled to the bias nodes via a respective resistor 550-1, 550-2. During calibration mode (FIG. 5c), the resistors 550-1, 550-2 may be activated. The input buffer circuit 500 is configured to, when the ADC is in an operation mode (FIG. 5d), bridge the resistor 550-1, 550-2, e.g., using the switches 560-1, 560-2. For example, the ADC may comprise a control circuit configured to control the ADC to selectively operate in the calibration mode or the operation mode. The control circuit may generate an enable signal which controls the bridging of the resistor 550-1, 550-2.

The first terminal of each of the source followers is coupled to a respective one of the clock nodes 540-1, 540-2 via a respective capacitor and a respective NAND gate 570-1, 570-2. The AC coupling capacitors and resistors 550-1, 550-2 may be chosen with a low-frequency cutoff below the frequency of the ring oscillator. This coupling may be similarly applied to any other pseudo-differential buffer topology than the one shown in FIG. 5a to FIG. 5d, e.g., any buffer with distinct bias current devices in each branch.

In some examples, the input buffer circuit 500 may be configured to, when the ADC is in the operation mode (FIG. 5d), input a logical 0 into the NAND gates 570-1, 570-2. In this manner, when the foreground calibration of the ADC is disabled, the gate bias voltages (bias signal 535) may be held at a fixed voltage regardless of clock signals 540-1, 540-2 and a strong connection may be made to the bias nodes to eliminate noise from the AC coupling resistors 550-1, 550-2.

FIG. 5c and FIG. 5d illustrate which components are active during foreground and background calibration. During foreground calibration (FIG. 5c), the input signal 515 may be held at a fixed common mode voltage, while the AC coupling may cause the output voltages (biased input signal 525) to toggle at the clock frequency around the nominal bias according to calibration clock signal 545. During background calibration (FIG. 5d), the clock connection may be disabled. Low-resistance switches may tie the bias control voltages (at the first terminal 530-1, 530-2; $V_{B+}$ and $V_{B-}$ in FIG. 5c and FIG. 5d) to the nominal value.

Figure 6:
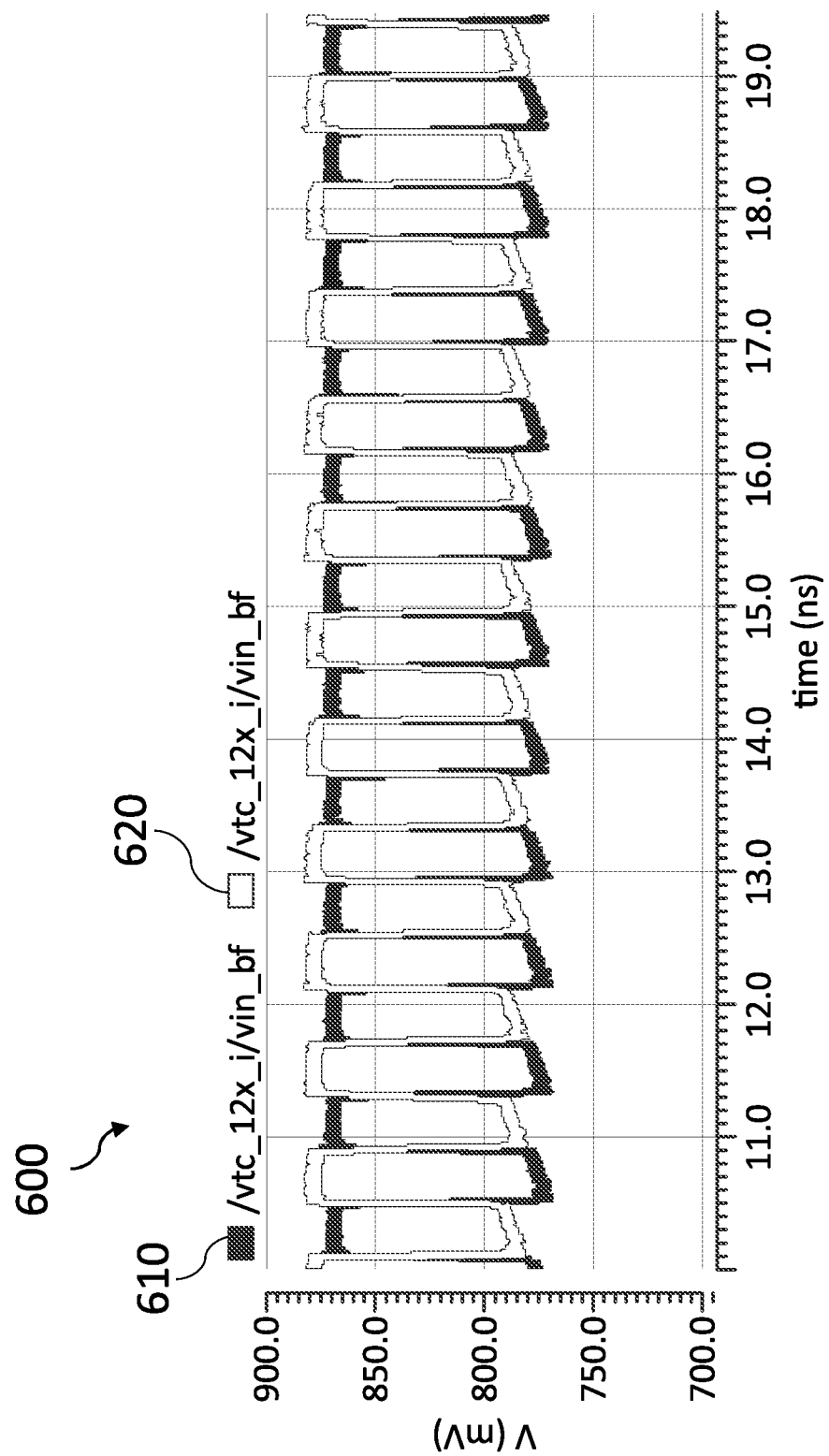
FIG. 6 illustrates an example of a calibration signal.

FIG. 6 illustrates a voltage-time diagram of an example of a calibration signal 600. The calibration signal 600 may be generated by an input buffer circuit, as described herein, e.g., by the input buffer circuit 500. The calibration signal 600 may be sampled by sub-ADCs of an ADC during foreground calibration.

The calibration signal 600 comprises a negative calibration signal 610 and a positive calibration signal 620 which form a differential calibration signal. The calibration signal 600 may have a square wave like course over time, e.g., following a clock frequency of a ring oscillator.

Figure 7:
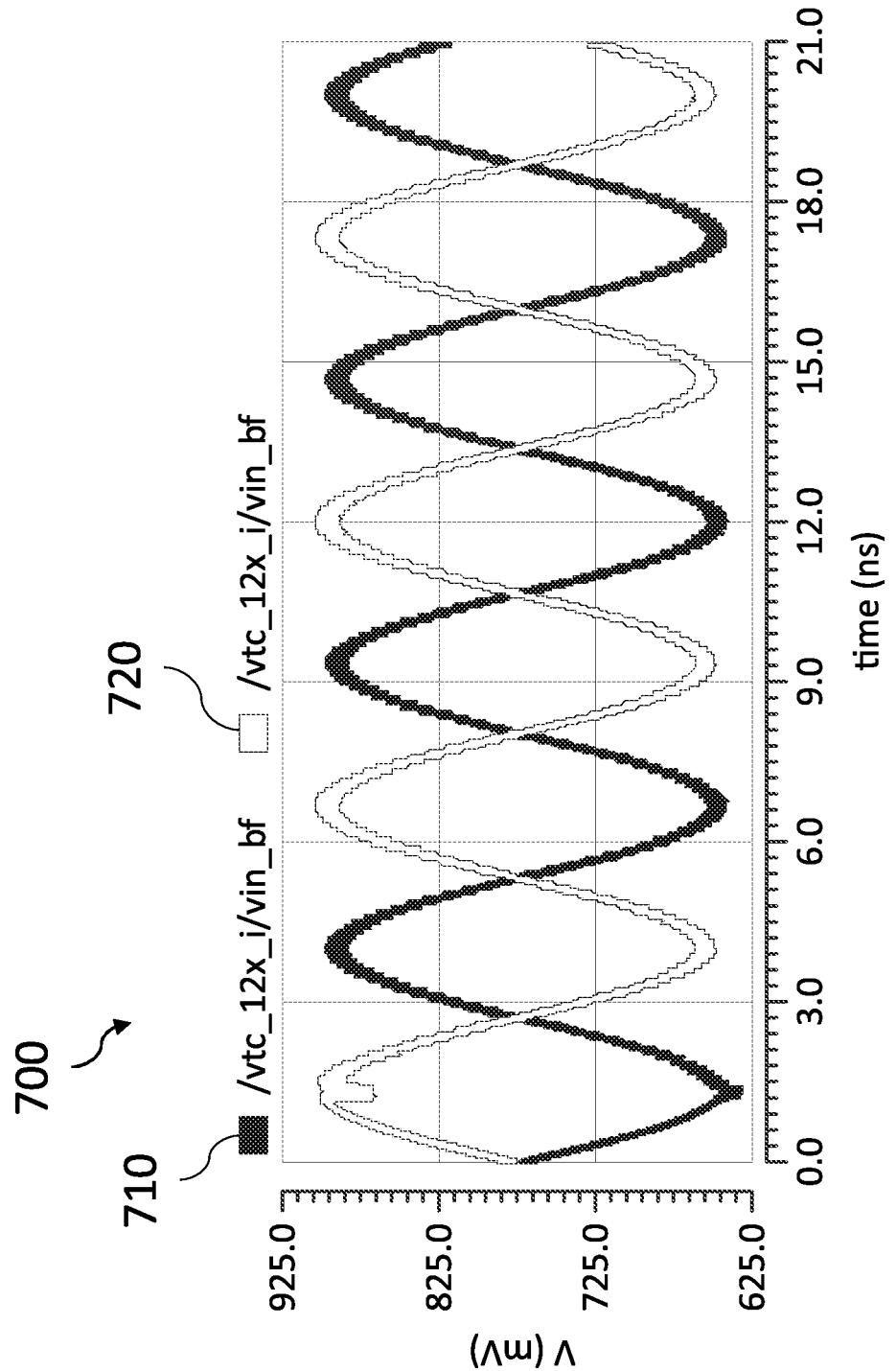
FIG. 7 illustrates an example of a biased input signal.

FIG. 7 illustrates a voltage-time diagram of an example of a biased input signal 700. The biased input signal 700 may be generated by an input buffer circuit, as described herein, e.g., by the input buffer circuit 500. The biased input signal 700 may be sampled by sub-ADCs of an ADC during background calibration.

The biased input signal 700 comprises a positive biased input signal 710 and a negative input signal 720 which form a differential biased input signal. Since the input buffer circuit may directly pass the input signal without modification by a calibration clock signal, the biased input signal 700 may exhibit substantially the same course as the input signal with amplification based on a bias signal. In the example of FIG. 7, the biased input signal 700 exhibits a sinusoidal course. It is to be noted that in other examples, the biased input signal 700 may have any other course than the one shown in FIG. 7, e.g., a periodic non-sinusoidal course.

Figure 8:
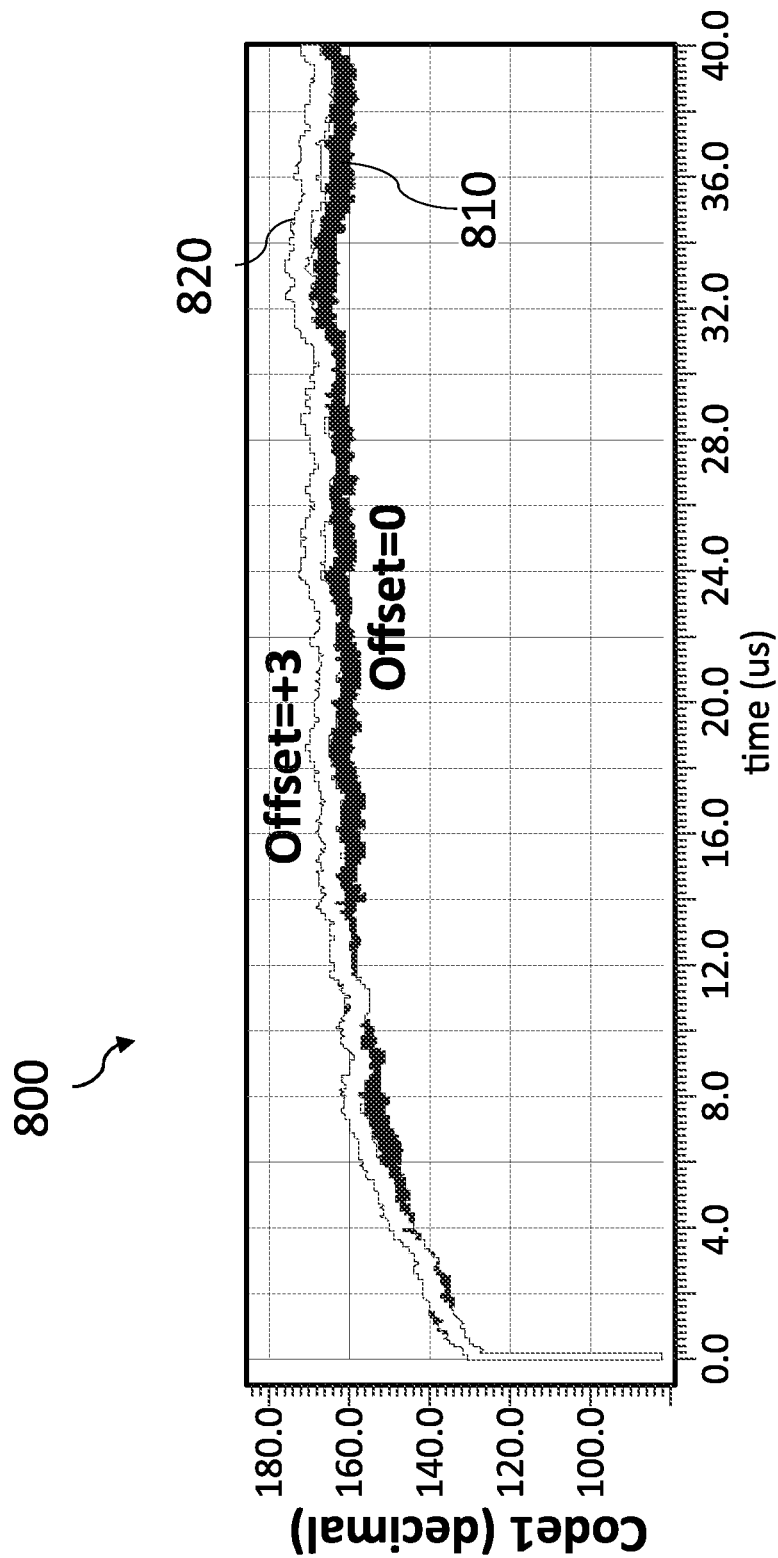
FIG. 8 illustrates an example of a digital-to-time converter code.

FIG. 8 illustrates a time diagram of an example of a DTC code 800. The DTC code 800 may be output by a calibration circuit of an ADC, as described herein, such as ADC 100, 200 or 300. The DTC code 800 may, e.g., be a mismatch between a phase shift and a predetermined phase shift of clock signals, determined by the calibration circuit during operation mode of the ADC.

The DTC code 800 comprises a first DTC code 810 for an unaligned detection circuit of the ADC and a second DTC code 820 for an aligned detection circuit. For example, the calibration circuit may have output the first DTC code 810 before an offset is set (offset=0) according to a difference in mismatches determined during calibration mode and operation mode. The calibration circuit may have output the second DTC code 810 after an offset is set (offset=3).

The impact of adding offset is a shift of the first DTC code 810 relative to the second DTC code 820. With an additional offset, the second DTC code 820 converges to a slightly higher value than the first DTC code 810. The amount of offset needed to match the background and foreground codes may be estimated by the calibration circuit, as described above.

Figure 9:
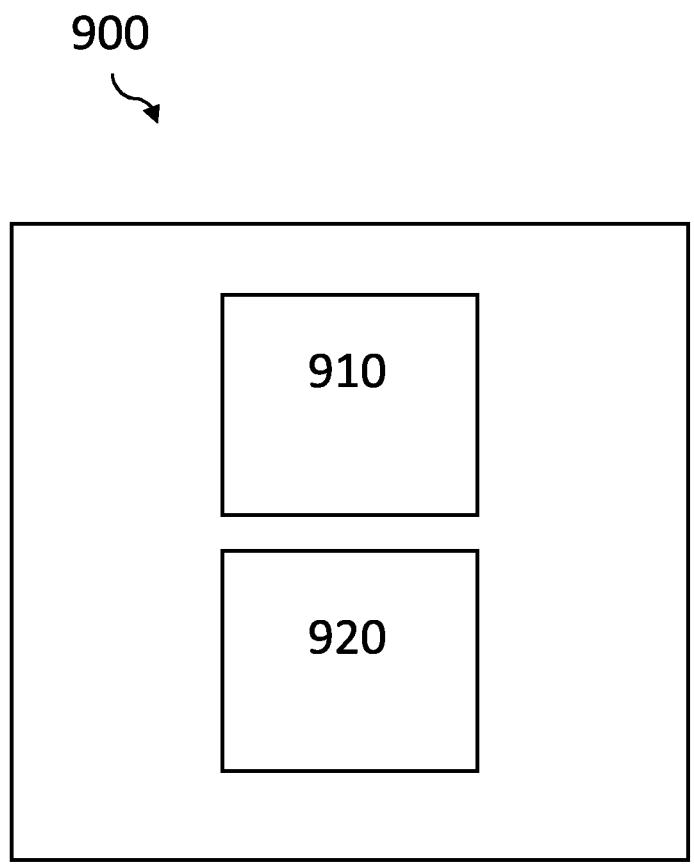
FIG. 9 illustrates an example of a receiver.

FIG. 9 illustrates an example of a receiver 900 comprising an ADC 910 as described herein, such as ADC 100, 200, or 300. The receiver 900 further comprises an analog circuit 920 coupled to the ADC 910 and configured to supply an input signal to the ADC 910. A biased input signal of the ADC 910 is based on the input signal.

In some examples, the analog circuitry 920 is configured to generate the input signal based on a radio frequency receive signal.

The ADC 910 may provide a combination of foreground and background calibration for precise clock skew correction and, thus, improve the accuracy of the receiver 900. The receiver 900 may comprise further hardware—conventional and/or custom.

Figure 10:
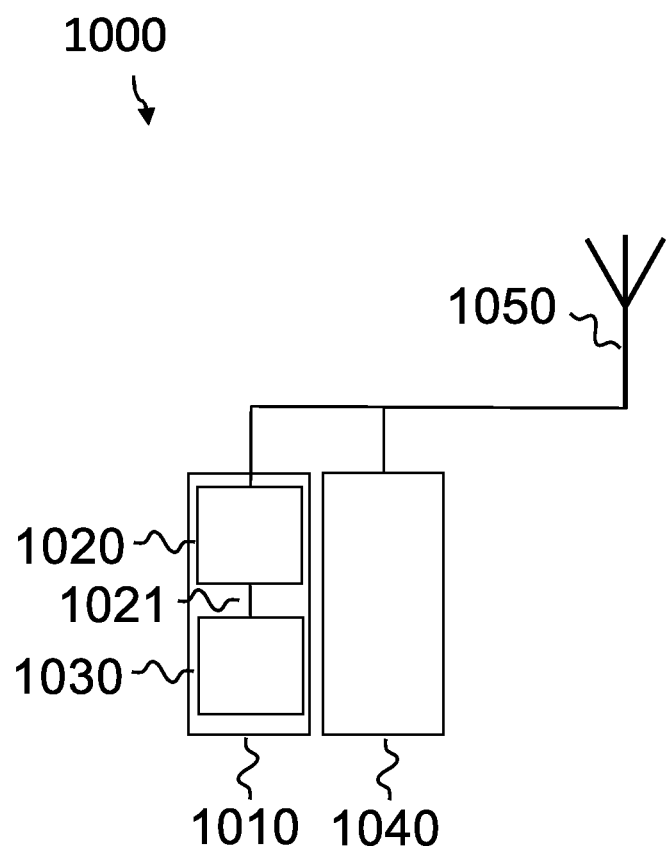
FIG. 10 illustrates an example of a radio base station.

An example of an implementation using an ADC according to one or more aspects of the architecture described above in connection with FIGS. 1 to 9 or one or more examples described above in connection with FIGS. 1 to 9 is illustrated in FIG. 10. FIG. 10 schematically illustrates an example of a radio base station 1000 (e.g., for a femtocell, a picocell, a microcell or a macrocell) comprising an ADC 1030 as proposed.

The base station 1000 comprises at least one antenna element 1050. A receiver 1010 of the base station 1000 comprises the ADC 1030 and is coupled to the antenna element 1050. The receiver 1010 may be coupled to the antenna element 1050 via one or more intermediate element such as one or more of a signal line, a filter, etc.

The receiver 1010 additionally comprises analog circuitry 1020 coupled to the apparatus 1030. The analog circuitry 1020 is configured to supply the input signal 1021 to the input node of the ADC 1030. The analog circuitry 1020 may comprise various elements such as one or more of a Low-Noise Amplifier (LNA), a filter, a down-converter (mixer), ElectroStatic Discharge (ESD) protection circuitry, an attenuator etc. For example, the analog circuitry 1020 may be configured to generate the analog input signal 1021 based on a RF receive signal received from the antenna element 1050 or another antenna element (not illustrated) of the base station 1000.

Additionally, the base station 1000 comprises a transmitter 1040 configured to generate an RF transmit signal. The transmitter 1040 may use the antenna element 1050 or another antenna element (not illustrated) of the base station 1000 for radiating the RF transmit signal to the environment. For example, the transmitter 1040 may be coupled to the antenna element 1050 via one or more intermediate elements such as a filter, an up-converter (mixer) or a Power Amplifier (PA).

To this end, a base station with improved analog-to-digital conversion may be provided allowing the base station to achieve increased bandwidth.

The base station 1000 may comprise further elements such as, e.g., an application processor, a baseband processor, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some examples, the baseband processor may be implemented, for example, as a solder-down substrate including one or more integrated circuits, a single packaged integrated circuit soldered to a main circuit board or a multi-chip module containing two or more integrated circuits.

In some examples, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some examples, the power management (integrated) circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some examples, the power tee circuitry may provide for electrical power drawn from a network cable to provide both power supply and data connectivity to the base station using a single cable.

In some examples, the network controller may provide connectivity to a network using a standard network interface protocol such as Ethernet. Network connectivity may be provided using a physical connection which is one of electrical (commonly referred to as copper interconnect), optical or wireless.

In some examples, the satellite navigation receiver may include circuitry to receive and decode signals transmitted by one or more navigation satellite constellations such as the Global Positioning System (GPS), GLObalnaya NAvigatSionnaya Sputnikovaya Sistema (GLONASS), Galileo and/ or BeiDou. The receiver may provide data to the application processor which may include one or more of position data or time data. The application processor may use time data to synchronize operations with other radio base stations.

In some examples, the user interface may include one or more of physical or virtual buttons, such as a reset button, one or more indicators such as Light Emitting Diodes (LEDs) and a display screen.

Figure 11:
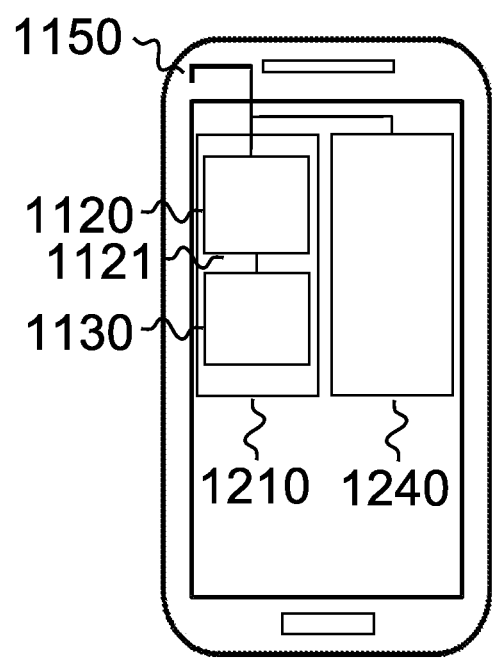
FIG. 11 illustrates an example of a mobile device.

Another example of an implementation using an ADC according to one or more aspects of the architecture described above in connection with FIGS. 1 to 9 or one or more examples described above in connection with FIGS. 1 to 9 is illustrated in FIG. 11. FIG. 11 schematically illustrates an example of a mobile device 1100 (e.g., mobile phone, smartphone, tablet-computer, or laptop) comprising an ADC 1130 as proposed.

The mobile device 1100 comprises at least one antenna element 1150. A receiver 1110 of the mobile device 1100 comprises the ADC 1130 and is coupled to the antenna element 1150. The receiver 1110 may be coupled to the antenna element 1150 via one or more intermediate element such as one or more of a signal line, a filter, etc.

The receiver 1110 additionally comprises analog circuitry 1120 coupled to the ADC 1130. The analog circuitry 1120 is configured to supply the input signal 1121 to the input node of the ADC 1130. The analog circuitry 1120 may comprise various elements such as one or more of a LNA, a filter, a down-converter (mixer), ESD protection circuitry, an attenuator etc. For example, the analog circuitry 1120 may be configured to generate the analog input signal 1121 based on a RF receive signal received from the antenna element 1150 or another antenna element (not illustrated) of the mobile device 1100.

Additionally, the mobile device 1100 comprises a transmitter 1140 configured to generate an RF transmit signal. The transmitter 1140 may use the antenna element 1150 or another antenna element (not illustrated) of the mobile device 1100 for radiating the RF transmit signal to the environment. For example, the transmitter 1140 may be coupled to the antenna element 1150 via one or more intermediate elements such as a filter, an up-converter (mixer) or a PA.

To this end, a mobile device with improved analog-to-digital conversion may be provided allowing the mobile device to achieve increased bandwidth.

The mobile device 1100 may comprise further elements such as, e.g., an application processor, a baseband processor, memory, a connectivity module, a Near Field Communication (NFC) controller, an audio driver, a camera driver, a touch screen, a display driver, sensors, removable memory, a power management integrated circuit or a smart battery.

In some examples, the application processor may include, for example, one or more CPU cores and one or more of cache memory, LDO regulators, interrupt controllers, serial interfaces such as SPI, $I^2C$ or universal programmable serial interface module, RTC, timer-counters including interval and watchdog timers, general purpose input-output (TO), memory card controllers such as SD/MMC or similar, USB interfaces, MIPI interfaces and JTAG test access ports.

In some examples, the baseband processor may be implemented, for example, as a solder-down substrate including one or more integrated circuits, a single packaged integrated circuit soldered to a main circuit board, and/or a multi-chip module containing two or more integrated circuits.

The wireless communication circuits using analog-to-digital conversion according to the proposed architecture or one or more of the examples described above may be configured to operate according to one of the 3rd Generation Partnership Project (3GPP)-standardized mobile communication networks or systems. The mobile or wireless communication system may correspond to, for example, a $5^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

For further illustrating the analog-to-digital conversion described above, FIG. 12 illustrates a flowchart of an example of a method 1200 for a time-interleaved ADC.

The method 1200 comprises, in a calibration mode of the ADC, outputting 1210 a first output signal by sampling a calibration signal based on a first clock signal and at least a second clock signal. The first clock signal exhibits a phase shift relative to the second clock signal. The method 1200 further comprises determining 1220 a first mismatch between the phase shift and a predetermined phase shift based on the first output signal. The method 1200 further comprises, in an operation mode of the ADC, outputting 1230 a second output signal by sampling one of a biased input signal or a second calibration signal based on at least one of the first clock signal and the second clock signal. The method 1200 further comprises determining 1240 a second mismatch between the phase shift and the predetermined phase shift based on the second output signal and calibrating 1250 the ADC based on the first and the second mismatch.

The method 1200 may enable improved analog-to-digital conversion with increased bandwidth.

More details and aspects of the method 1200 are explained in connection with the proposed technique or one or more examples described above (e.g., FIGS. 1 to 9). The method 1200 may comprise one or more additional optional features corresponding to one or more aspects of the proposed technique, or one or more examples described above.

For example, the method 1200 may further comprise determining a difference between the first mismatch and the second mismatch and calibrating the ADC based on the difference. The second mismatch may be determined within a predefined time period after starting the operation mode, and the method 1200 may further comprise determining a third mismatch between the phase shift and the predetermined phase shift based on the second output signal after the predefined time period and calibrating the ADC based on the third mismatch. Calibrating 1250 the ADC may comprise delaying at least one of the first and the second clock signal based on the first and the second mismatch. Determining 1220 the first mismatch may comprise determining a zero crossing index of the first output signal. Determining 1240 the second mismatch may comprise determining a zero crossing index of the second output signal.

In the following, some examples of the proposed concept are presented:

An example (e.g., example 1) relates to an analog-to-digital converter, ADC, comprising multiple time-interleaved sub-ADCs, a detection circuit, and a calibration circuit, wherein the sub-ADCs are configured to, when the ADC is in a calibration mode, generate a first signal by sampling a calibration signal based on a first clock signal and at least a second clock signal, wherein the first clock signal comprises a phase shift relative to the second clock signal, wherein the calibration circuit is configured to determine a first mismatch between the phase shift and a phase shift threshold based on the first signal, wherein the detection circuit is configured to, when the ADC is in an operation mode, generate a second signal by sampling one of a biased signal to be received by the sub-ADCs or a second calibration signal based on at least one of the first clock signal and the second clock signal, wherein the calibration circuit is configured to determine a second mismatch between the phase shift and the phase shift threshold based on the second signal, and calibrate the ADC based on the first and the second mismatch.

Another example (e.g., example 2) relates to a previous example (e.g., example 1) or to any other example, further comprising that the calibration circuit is further configured to determine a difference between the first mismatch and the second mismatch, and calibrate the ADC based on the difference.

Another example (e.g., example 3) relates to a previous example (e.g., one of the examples 1 or 2) or to any other example, further comprising that the calibration circuit is configured to determine the second mismatch within a predefined time period after starting the operation mode, determine a third mismatch between the phase shift and the predetermined phase shift threshold based on the second signal after the predefined time period, and calibrate the ADC based on the third mismatch.

Another example (e.g., example 4) relates to a previous example (e.g., one of the examples 1 to 3) or to any other example, further comprising that the calibration circuit comprises at least one delay circuit configured to calibrate the ADC by delaying at least one of the first and the second clock signal based on the first and the second mismatch.

Another example (e.g., example 5) relates to a previous example (e.g., one of the examples 1 to 4) or to any other example, further comprising that the calibration circuit is configured to determine the first mismatch by determining a zero crossing index of the first signal.

Another example (e.g., example 6) relates to a previous example (e.g., one of the examples 1 to 5) or to any other example, further comprising that the calibration circuit is configured to determine the second mismatch by determining a zero crossing index of the second signal.

Another example (e.g., example 7) relates to a previous example (e.g., one of the examples 1 to 6) or to any other example, further comprising that the detection circuit comprises at least one reference sub-ADC and/or at least one phase detector.

Another example (e.g., example 8) relates to a previous example (e.g., one of the examples 1 to 7) or to any other example, further comprising a ring oscillator configured to generate a calibration clock signal, wherein at least one of the calibration signal and the second calibration signal is based on the calibration clock signal.

Another example (e.g., example 9) relates to a previous example (e.g., one of the examples 1 to 8) or to any other example, further comprising a control circuit configured to control the ADC to selectively operate in the calibration mode or the operation mode.

Another example (e.g., example 10) relates to a previous example (e.g., one of the examples 1 to 9) or to any other example, further comprising an input buffer circuit comprising an input node configured to, when the ADC is in the operation mode, receive an input signal, a bias node configured to receive a bias signal, and a clock node configured to receive a calibration clock signal, wherein the input buffer circuit is configured to, when the ADC is in the calibration mode, generate the calibration signal based on the calibration clock signal and the bias signal.

Another example (e.g., example 11) relates to a previous example (e.g., example 10) or to any other example, further comprising that the input buffer circuit comprises at least one source follower, wherein a first terminal of the source follower is coupled to the bias node and the clock node, and wherein a second terminal of the source follower is coupled to the input node.

Another example (e.g., example 12) relates to a previous example (e.g., example 11) or to any other example, further comprising that the first terminal is coupled to the bias node via a resistor, and wherein the input buffer circuit is configured to, when the ADC is in the operation mode, bridge the resistor.

Another example (e.g., example 13) relates to a previous example (e.g., one of the examples 11 or 12) or to any other example, further comprising that the first terminal is coupled to the clock node via a capacitor and a NAND gate, and wherein the input buffer circuit is configured to, when the ADC is in the operation mode, input a logical 0 into the NAND gate.

An example (e.g., example 14) relates to a receiver, comprising an ADC according to a previous example (e.g., one of the examples 1 to 13), and an analog circuit coupled to the ADC and configured to supply an input signal to the ADC, wherein the biased input signal is based on the input signal.

Another example (e.g., example 15) relates to a previous example (e.g., example 14) or to any other example, further comprising that the analog circuitry is configured to generate the input signal based on a radio frequency receive signal.

An example (e.g., example 16) relates to a base station, comprising a receiver according to a previous example (e.g., example 14 or 15), and a transmitter configured to generate a radio frequency transmit signal.

Another example (e.g., example 17) relates to a previous example (e.g., example 16) or to any other example, further comprising at least one antenna coupled to at least one of the receiver and the transmitter.

An example (e.g., example 18) relates to a mobile device, comprising a receiver according to a previous example (e.g., example 14 or 15), and a transmitter configured to generate a radio frequency transmit signal.

Another example (e.g., example 19) relates to a previous example (e.g., example 18) or to any other example, further comprising at least one antenna coupled to at least one of the receiver and the transmitter.

An example (e.g., example 20) relates to a method for a time-interleaved analog-to-digital converter, ADC, comprising in a calibration mode of the ADC, generating a first signal by sampling a calibration signal based on a first clock signal and at least a second clock signal, wherein the first clock signal exhibits comprises a phase shift relative to the second clock signal, determining a first mismatch between the phase shift and a predetermined phase shift threshold based on the first signal, in an operation mode of the ADC, generating a second signal by sampling one of a biased input signal or a second calibration signal based on at least one of the first clock signal and the second clock signal, determining a second mismatch between the phase shift and the predetermined phase shift threshold based on the second signal, and calibrating the ADC based on the first and the second mismatch.

Another example (e.g., example 21) relates to a previous example (e.g., example 20) or to any other example, further comprising determining a difference between the first mismatch and the second mismatch, and calibrating the ADC based on the difference.

Another example (e.g., example 22) relates to a previous example (e.g., one of the examples or 21) or to any other example, further comprising that the second mismatch is determined within a predefined time period after starting the operation mode, wherein the method further comprises determining a third mismatch between the phase shift and the predetermined phase shift threshold based on the second signal after the predefined time period, and calibrating the ADC based on the third mismatch.

Another example (e.g., example 23) relates to a previous example (e.g., one of the examples 20 to 22) or to any other example, further comprising that calibrating the ADC comprises delaying at least one of the first and the second clock signal based on the first and the second mismatch.

Another example (e.g., example 24) relates to a previous example (e.g., one of the examples 20 to 23) or to any other example, further comprising that determining the first mismatch comprises determining a zero crossing index of the first signal.

Another example (e.g., example 25) relates to a previous example (e.g., one of the examples to 24) or to any other example, further comprising that determining the second mismatch comprises determining a zero crossing index of the second signal.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An analog-to-digital converter, ADC, comprising:
   multiple time-interleaved sub-ADCs;
   a detection circuit; and
   a calibration circuit,
   wherein the sub-ADCs are configured to, when the ADC is in a calibration mode, generate a first signal by sampling a calibration signal based on a first clock signal and at least a second clock signal, wherein the first clock signal comprises a phase shift relative to the second clock signal, wherein the calibration circuit is configured to determine a first mismatch between the phase shift and a phase shift threshold based on the first signal,
   wherein the detection circuit is configured to, when the ADC is in an operation mode generate a second signal by sampling one of a biased signal to be received by the sub-ADCs or a second calibration signal based on at least one of the first clock signal and the second clock signal, wherein the calibration circuit is configured to:
   determine a second mismatch between the phase shift and the phase shift threshold based on the second signal; and
   calibrate the ADC based on the first and the second mismatch.

2. The ADC of claim 1, wherein the calibration circuit is further configured to:
   determine a difference between the first mismatch and the second mismatch; and
   calibrate the ADC based on the difference.

3. The ADC of claim 1, wherein the calibration circuit is configured to:
   determine the second mismatch within a predefined time period after starting the operation mode;
   determine a third mismatch between the phase shift and the phase shift threshold based on the second signal after the predefined time period; and
   calibrate the ADC based on the third mismatch.

4. The ADC of claim 1, wherein the calibration circuit comprises at least one delay circuit configured to calibrate the ADC by delaying at least one of the first and the second clock signal based on the first and the second mismatch.

5. The ADC of claim 1, wherein the calibration circuit is configured to determine the first mismatch by determining a zero crossing index of the first signal.

6. The ADC of claim 1, wherein the calibration circuit is configured to determine the second mismatch by determining a zero crossing index of the second signal.

7. The ADC of claim 1, wherein the detection circuit comprises at least one reference sub-ADC and/or at least one phase detector.

8. The ADC of claim 1, further comprising a ring oscillator configured to generate a calibration clock signal, wherein at least one of the calibration signal and the second calibration signal is based on the calibration clock signal.

9. The ADC of claim 1, further comprising a control circuit configured to control the ADC to selectively operate in the calibration mode or the operation mode.

10. The ADC of claim 1, further comprising:
    an input buffer circuit comprising an input node configured to, when the ADC is in the operation mode, receive an input signal;
    a bias node configured to receive a bias signal; and
    a clock node configured to receive a calibration clock signal, wherein the input buffer circuit is configured to, when the ADC is in the calibration mode, generate the calibration signal based on the calibration clock signal and the bias signal.

11. The ADC of claim 10, wherein the input buffer circuit comprises at least one source follower, wherein a first terminal of the source follower is coupled to the bias node and the clock node, and wherein a second terminal of the source follower is coupled to the input node.

12. The ADC of claim 11, wherein the first terminal is coupled to the bias node via a resistor, and wherein the input buffer circuit is configured to, when the ADC is in the operation mode, bridge the resistor.

13. The ADC of claim 11, wherein the first terminal is coupled to the clock node via a capacitor and a NAND gate, and wherein the input buffer circuit is configured to, when the ADC is in the operation mode, input a logical 0 into the NAND gate.

14. A receiver, comprising:
    an ADC according to claim 1; and
    an analog circuit coupled to the ADC and configured to supply an input signal to the ADC, wherein the biased signal is based on the input signal.

15. The receiver of claim 14, wherein the analog circuitry is configured to generate the input signal based on a radio frequency receive signal.

16. A base station, comprising:
    a receiver according to claim 14; and
    a transmitter configured to generate a radio frequency transmit signal.

17. The base station of claim 16, further comprising at least one antenna coupled to at least one of the receiver and the transmitter.

18. A method for a time-interleaved analog-to-digital converter, ADC, comprising:
    in a calibration mode of the ADC, generating a first signal by sampling a calibration signal based on a first clock signal and at least a second clock signal, wherein the first clock signal comprises a phase shift relative to the second clock signal;

determining a first mismatch between the phase shift and a phase shift threshold based on the first signal;

in an operation mode of the ADC, generating a second signal by sampling one of a biased signal or a second calibration signal based on at least one of the first clock signal and the second clock signal;

determining a second mismatch between the phase shift and the phase shift threshold based on the second signal; and calibrating the ADC based on the first and the second mismatch.

19. The method of claim 18, further comprising:
determining a difference between the first mismatch and the second mismatch; and
calibrating the ADC based on the difference.

20. The method of claim 18, wherein the second mismatch is determined within a predefined time period after starting the operation mode, wherein the method further comprises:
determining a third mismatch between the phase shift and the phase shift threshold based on the second signal after the predefined time period; and
calibrating the ADC based on the third mismatch.

21. The method of claim 18, wherein calibrating the ADC comprises delaying at least one of the first and the second clock signal based on the first and the second mismatch.

22. The method of claim 18, wherein determining the first mismatch comprises determining a zero crossing index of the first signal.

23. The method of claim 18, wherein determining the second mismatch comprises determining a zero crossing index of the second signal.

* * * * *